United States Patent
Kang et al.

(10) Patent No.: US 9,445,504 B2
(45) Date of Patent: Sep. 13, 2016

(54) METHODS OF MANUFACTURING METAL WIRING BURIED FLEXIBLE SUBSTRATE AND FLEXIBLE SUBSTRATES MANUFACTURED BY THE SAME

(75) Inventors: Jae Wook Kang, Gyeongsangnam-do (KR); Do Geun Kim, Gyeongsangnam-do (KR); Jong Kuk Kim, Gyeongsangnam-do (KR); Sung Hun Jung, Seoul (KR); Myungkwan Song, Ulsan (KR); Dae Sung You, Gyeongsangnam-do (KR); Chang Soo Kim, Gyeongsangnam-do (KR); Kee Seok Nam, Gyeongsangnam-do (KR)

(73) Assignee: Korea Institute of Machinery and Materials, Daejeon (KR)

( * ) Notice: Subject to any disclaimer, the term of this patent is extended or adjusted under 35 U.S.C. 154(b) by 366 days.

(21) Appl. No.: 14/004,557

(22) PCT Filed: Apr. 19, 2012

(86) PCT No.: PCT/KR2012/003012
§ 371 (c)(1),
(2), (4) Date: Sep. 11, 2013

(87) PCT Pub. No.: WO2012/144827
PCT Pub. Date: Oct. 26, 2012

(65) Prior Publication Data
US 2014/0000943 A1    Jan. 2, 2014

(30) Foreign Application Priority Data

| Apr. 20, 2011 | (KR) | 10-2011-0036471 |
| Apr. 20, 2011 | (KR) | 10-2011-0036472 |
| Jul. 1, 2011 | (KR) | 10-2011-0065499 |
| Aug. 10, 2011 | (KR) | 10-2011-0079720 |
| Mar. 14, 2012 | (KR) | 10-2012-0026063 |

(51) Int. Cl.
*H05K 3/00* (2006.01)
*H05K 3/10* (2006.01)
*H05K 1/02* (2006.01)
*H05K 3/20* (2006.01)
*H05K 1/03* (2006.01)
*H05K 3/24* (2006.01)

(52) U.S. Cl.
CPC .............. *H05K 3/0017* (2013.01); *H05K 1/02* (2013.01); *H05K 3/10* (2013.01); *H05K 3/207* (2013.01); *H05K 1/0393* (2013.01); *H05K 3/246* (2013.01); *H05K 2201/0376* (2013.01); *Y10T 29/49156* (2015.01)

(58) Field of Classification Search
CPC .. H05K 3/0017; H05K 3/002; H05K 3/0023; H05K 3/0026; H05K 3/0032; H05K 3/0035; H05K 3/0038; H05K 3/0041
See application file for complete search history.

(56) References Cited

FOREIGN PATENT DOCUMENTS

| JP | 2000003944 A | 1/2000 |
| JP | 2005136318 A | 5/2005 |
| KR | 100735339 B1 | 7/2007 |
| KR | 1020100027526 A | 3/2010 |

OTHER PUBLICATIONS

PCT International Search Report dated Nov. 29, 2012 for Intl. App. No. PCT/KR2012/003012, from which the instant application is based, 2 pgs.

*Primary Examiner* — Jeremy C Norris
(74) *Attorney, Agent, or Firm* — Fredrikson & Byron, P.A.

(57) ABSTRACT

Disclosed are a method of manufacturing a metal wiring buried flexible substrate and a flexible substrate manufactured by the same. The method includes coating a sacrificial layer including a polymer soluble in water or an organic solvent, or a photodegradable polymer on a substrate (Step 1), forming a metal wiring on the sacrificial layer in Step 1 (Step 2), forming a metal wiring buried polymer layer by coating a curable polymer on the sacrificial layer including the metal wiring formed thereon in Step 2 and curing (Step 3) and separating the polymer layer in Step 3 from the substrate in Step 1 by removing through dissolving in the water or the organic solvent or photodegrading only the sacrificial layer present between the substrate in Step 1 and the polymer layer in Step 3 (Step 4).

13 Claims, 11 Drawing Sheets before electroplating    after Cu electroplating before electroplating    after Cu electroplating ically insulated from each other. However, a very complicated process is necessary for manufacturing the multi-layer circuit patterns on the circuit substrate, and the verification of the generation of a wiring defect during performing the manufacturing process may be difficult. Particularly, for a recently developed wafer level package, in which a circuit wiring may be directly formed on a semiconductor chip, the formation of a multi-layer circuit substrate may be very difficult because the area of the wafer level package is very small.

METHODS OF MANUFACTURING METAL WIRING BURIED FLEXIBLE SUBSTRATE AND FLEXIBLE SUBSTRATES MANUFACTURED BY THE SAME

RELATED APPLICATIONS

This application is a 35 U.S.C. 371 national stage filing from International Application No. PCT/KR2012/003012 filed Apr. 19, 2012, and claims priority to Korean Applications Nos. 10-2011-0036471 and 10-2011-0036472 both filed Apr. 20, 2011; Korean Application No. 10-2011-0065499 filed Jul. 1, 2011; Korean Application No. 10-2011-0079720 filed Aug. 10, 2011; and Korean Application No. 10-2012-0026063 filed Mar. 14, 2012, the teachings of all of which are incorporated herein by reference.

TECHNICAL FIELD

The present disclosure relates to methods of manufacturing a metal wiring buried flexible substrate and flexible substrates manufactured by the same.

BACKGROUND ART

Recently, various home appliances and electronic products have been developed in line with the technical development in electric industry and electronic industry. Most of the home appliances and the electronic products include a circuit substrate, into which an electric device, an electronic device and a semiconductor package may be inserted. The circuit substrate includes a circuit wiring for an electric connection of the electric device, the electronic device and the semiconductor package. Commonly used circuit wirings may be formed by patterning a metal layer formed on an insulating substrate. When the circuit wirings formed on the insulating substrate intersect on the same plane, a short between the circuit wirings may be generated. Thus, a common circuit substrate may include multi-layer circuit patterns electrically insulated from each other. However, a very complicated process is necessary for manufacturing the multi-layer circuit patterns on the circuit substrate, and the verification of the generation of a wiring defect during performing the manufacturing process may be difficult. Particularly, for a recently developed wafer level package, in which a circuit wiring may be directly formed on a semiconductor chip, the formation of a multi-layer circuit substrate may be very difficult because the area of the wafer level package is very small.

Meanwhile, the width of the wiring becomes narrower to form a large number of more complicated wirings on a substrate. The cross-sectional area of the wiring may be decreased according to the decrease of the width of the wiring. Thus, the resistance of the wiring may be increased, power efficiency may be decreased and heat may be generated. In order to solve the above-described defects, (1) a specific resistance (p) is necessary to be lowered, (2) a wiring length is necessary to be decreased, or (3) a wiring height (thickness) is necessary to be increased. With respect to method (1), the development of a material having a lower specific resistance than that of widely used copper, aluminum or silver may be difficult. With respect to method (2), practical application may be difficult concerning a circuit designing matter. With respect to method (3), the wiring may collapse, or a short between wirings may be generated in line with the increase of the height of the wiring.

Accordingly, a technique on inserting a metal wiring into a substrate is necessary. As for common methods of inserting the metal wiring into the substrate, an etching method for obtaining a desired pattern through a deposition and etching, and a damascene method of inlaying a wiring into a groove in an insulating layer by applying a copper (Cu) film, which may be hardly dry etched for forming a pattern and a CMP method, may be illustrated.

According to the above-described common methods, lots of materials may be consumed, and the process may be conducted through various steps including deposition, patterning, etching, etc and may be complicated. In addition, since the metal layer is formed by an electroplating method, etc., a heat treatment at a high temperature may be necessary. In this case, a non-conductive material having a high temperature resistance may be required.

In Japanese Laid-open Patent Publication No. 2005-136318, a wiring substrate including a buried wiring in a transparent resin member is disclosed. Disclosed also is a method of manufacturing a wiring substrate including a wiring forming process for forming a metal wiring on a substrate, an integrating process for forming a transparent resin member by coating and drying a transparent resin solution to cover the metal wiring, and a separating process for separating the transparent resin member from the substrate. In the manufacturing method, an organic separator such as a silicon resin, a fluorine resin, etc. and an inorganic separator such as a diamond like carbon (DLC) thin film, a zirconium oxide thin film, etc. may be formed on the surface of the substrate in advance to facilitate the separating process.

However, when the inorganic separator is used, the separation of the wiring and the member may not be easily performed while conducting the separating process of the member and the metal wiring from the substrate. In this case, a portion of the metal wiring and the member may remain on the surface of the substrate, and the organic material used as the separator may stain the wiring and the surface of the member. That is, the metal wiring of the wiring substrate may be incompletely separated from the substrate even though using the separator.

The present inventors hare been studied on the method or manufacturing a flexible substrate having a dented (buried) type metal wiring and completed a method of clearly separating a metal wiring and a polymer material (flexible substrate) from a substrate by forming a sacrificial layer removable by the light or a solvent, the metal wiring and the polymer material (flexible substrate) on a substrate and clearly removing the sacrificial layer by using the light or the solvent.

DISCLOSURE OF THE INVENTION

Technical Problem

One object of the present invention is to provide a method of manufacturing a metal wiring buried flexible substrate and a flexible substrate manufactured by the same.

Technical Solution

In order to achieve the object, the present invention provides the following example embodiment.

According to a first aspect of the present invention, a method of manufacturing a metal wiring buried flexible substrate is provided. The method includes:

coating a sacrificial layer including a polymer soluble in water or an organic solvent, or a photodegradable polymer on a substrate (Step 1);

forming a metal wiring on the sacrificial layer in Step 1 (Step 2);

forming a metal wiring buried polymer layer by coating a curable polymer on the sacrificial layer including the metal wiring formed thereon in Step 2 and curing (Step 3); and separating the polymer layer in Step 3 from the substrate in Step 1 by removing through dissolving in the water or the organic advent or photodegrading only the sacrificial layer present between the substrate in Step 1 and the polymer layer in Step 3 (Step 4).

According to a second aspect of the present invention, a method of manufacturing a metal wiring buried flexible substrate is provided. The method includes:

coating a sacrificial layer including a polymer soluble in water or an organic solvent, or a photodegradable polymer on a substrate (Step 1);

forming a metal wiring on the sacrificial layer in Step 1 (Step 2);

coating a curable polymer layer on the sacrificial layer including the metal wiring formed thereon in Step 2 (Step 3);

attaching a functional flexible substrate on the curable polymer layer in Step 3 and curing the curable polymer layer (Step 4); and separating the polymer layer attached to the functional flexible substrate in Step 4 from the substrate in Step 1 by removing through dissolving in the water or the organic solvent or photodegrading only the sacrificial layer present between the substrate in Step 1 and the polymer layer in Step 4 (Step 5).

According to a third aspect of the present invention, a method of manufacturing a metal wiring buried flexible substrate is provided. The method includes:

coating a sacrificial layer including a polymer soluble in water or an organic solvent, or a photodegradable polymer on a substrate (Step 1);

forming a metal wiring on the sacrificial layer in Step 1 (Step 2);

forming a metal wiring buried polymer layer by coating a curable polymer on the sacrificial layer including the metal wiring formed thereon in Step 2 and curing (Step 3);

separating the polymer layer in Step 3 from the substrate in Step 1 by removing through dissolving in the water or the organic solvent or photodegrading only the sacrificial layer present between the substrate in Step 1 and the polymer layer in Step 3 (Step 4); and depositing or coating a transparent electrode on an exposed surface portion of the metal wiring of the separated polymer layer in Step 4 (Step 5).

According to a fourth aspect of the present invention, a method of manufacturing a metal wiring buried flexible substrate is provided. The method includes:

coating a sacrificial layer including a polymer soluble in water or an organic solvent, or a photodegradable polymer on a substrate (Step 1);

forming a metal wiring on the sacrificial layer in Step 1 (Step 2);

forming a metal wiring buried polymer layer by coating a curable polymer on the sacrificial layer including the metal wiring formed thereon in Step 2 and curing (Step 3);

separating the polymer layer in Step 3 from the substrate in Step 1 by removing through dissolving in the water or the organic solvent or photodegrading only the sacrificial layer present between the substrate in Step 1 and the polymer layer in Step 3 (Step 4); and electroplating a metal electrode on an exposed surface portion of the metal wiring of the separated polymer layer from the substrate in Step 4 (Step 5).

According to a fifth aspect of the present invention, a method of manufacturing a metal wiring buried flexible substrate is provided. The method includes:

coating a separating layer on a substrate (Step 1);

coating a sacrificial layer including a polymer soluble in water or an organic solvent, or a photodegradable polymer on the coated separating layer in Step 1 (Step 2);

forming a metal wiring on the sacrificial layer in Step 2 (Step 3);

forming a metal wiring buried polymer layer by coating a curable polymer on the sacrificial layer including the metal wiring formed thereon in Step 3 and curing (Step 4);

removing the substrate and the separating layer in Step 1 by applying a physical force (Step 5); and removing only the sacrificial layer exposed after removing the substrate in Step 1 by performing Step 5 through dissolving in water or in an organic solvent or through photodegrading the sacrificial layer (Step 6).

According to a sixth aspect of the present invention, a method of manufacturing a metal wiring buried flexible substrate is provided. The method includes:

coating a separating layer on a substrate (Step 1);

coating a sacrificial layer including a polymer soluble in water or an organic solvent, or a photodegradable polymer on the coated separating layer in Step 1 (Step 2);

forming a metal wiring on the sacrificial layer in Step 2 (Step 3);

forming a curable polymer layer on the sacrificial layer including the metal wiring formed thereon in Step 3 and curing (Step 4);

attaching a functional flexible substrate on the curable polymer layer in Step 4 and curing the curable polymer layer (Step 5);

removing the substrate and the separating layer in Step 1 by applying a physical force (Step 6); and removing only the sacrificial layer exposed after removing the substrate in Step 1 by performing Step 6 through dissolving in the water or in the organic solvent or through photodegrading the sacrificial layer (Step 7).

According to a seventh aspect of the present invention, a method of manufacturing a metal wiring buried flexible substrate is provided. The method includes:

coating a separating layer on a substrate (Step 1);

coating a sacrificial layer including a polymer soluble in water or an organic solvent, or a photodegradable polymer on the coated separating layer in Step 1 (Step 2);

forming a metal wiring on the sacrificial layer in Step 2 (Step 3);

forming a metal wiring buried polymer layer by coating a curable polymer on the sacrificial layer including the metal wiring formed thereon in Step 3 and curing (Step 4);

removing the substrate and the separating layer in Step 1 by applying a physical force (Step 5);

removing only the sacrificial layer exposed after removing the substrate in Step 1 by performing Step 5 through dissolving in the water or in the organic solvent or through photodegrading the sacrificial layer (Step 7); and depositing or coating a transparent electrode on an exposed surface portion of the metal wiring in Step 6 (Step 7).

According to an eighth aspect of the present invention, a method of manufacturing a metal wiring buried flexible substrate as provided. The method includes:

coating a separating layer on a substrate (Step 1);

coating a sacrificial layer including a polymer soluble in water or an organic solvent, or a photodegradable polymer on the coated separating layer in Step 1 (Step 2);

forming a metal wiring on the sacrificial layer in Step 2 (Step 3);

forming a metal wiring buried polymer layer by coating a curable polymer on the sacrificial layer including the metal wiring formed thereon in Step 3 and curing (Step 4);

removing the substrate and the separating layer in Step 1 by applying a physical force (Step 5);

removing only the sacrificial layer exposed after removing the substrate in Step 1 by performing Step 5 through dissolving in the water or in the organic solvent or through photodegrading the sacrificial layer (Step 7); and electroplating a metal electrode on an exposed surface portion of the metal wiring through removing the sacrificial layer in Step 6 (Step 7).

According to the above-described methods, the removing methods of only the sacrificial layer may be different according to the kind of the sacrificial layers. The sacrificial layer made by using a polymer soluble in water or an organic solvent may be removed through a dissolving process. The sacrificial layer made by using a photodegradable polymer may be removed through a light irradiating process.

In addition, the present invention provides a metal wiring buried flexible substrate, in which a polymer layer and a metal wiring are integrated one by one and the metal wiring is provided in the polymer layer.

Advantageous Effects

According to the method of manufacturing a metal wiring buried flexible substrate, a metal wiring may be inserted into the flexible substrate by using a sacrificial layer made by using a polymer soluble in water or an organic solvent or a photodegradable polymer, and a wiring having a low resistance irrespective of the height of the metal wiring may be formed. In addition, through separating the metal wiring buried flexible substrate from the substrate by removing the sacrificial layer using water or an organic solvent, or the light, the metal wiring buried flexible substrate may be clearly separated from the substrate.

BEST MODE FOR CARRYING OUT THE INVENTION

Hereinafter, the present invention will be described in more detail.

Figure 1:
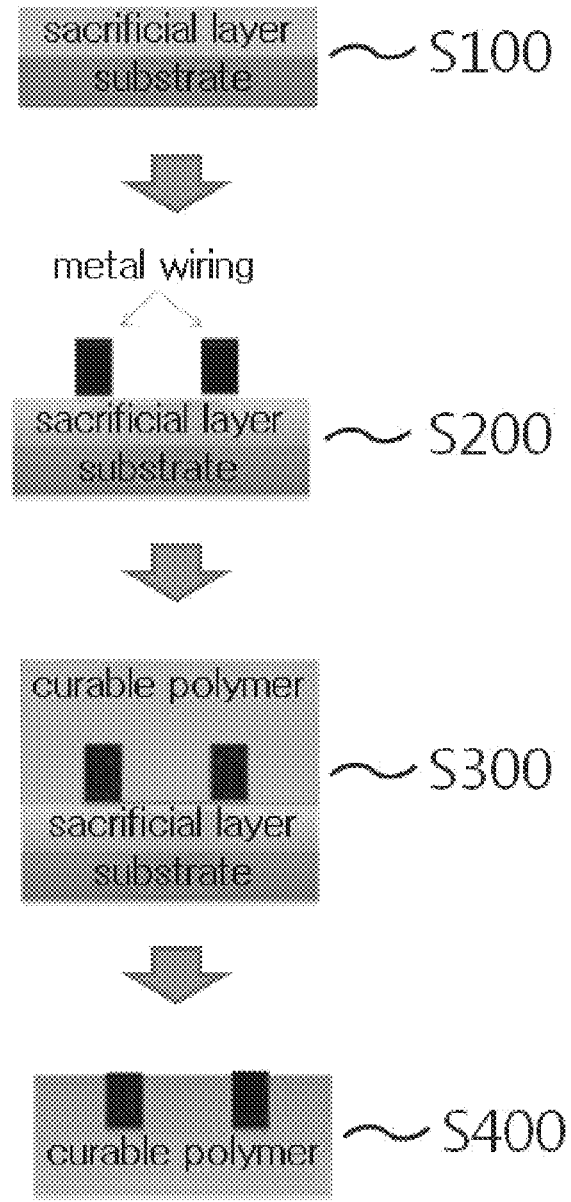
FIGS. 1 to 4 are schematic diagrams illustrating a method of manufacturing a metal wiring buried flexible substrate step by step according to the present invention.

According to a first aspect of the present invention, there is provided a method of manufacturing a metal wiring buried flexible substrate including:

coating a sacrificial layer including a polymer soluble in water or an organic solvent, or a photodegradable polymer on a substrate (Step 1);

forming a metal wiring on the sacrificial layer in Step 1 (Step 2);

forming a metal wiring buried polymer layer by coating a curable polymer on the sacrificial layer including the metal wiring formed thereon in Step 2 and curing (Step 3); and separating the polymer layer in Step 3 from the substrate in Step 1 by removing through dissolving in the water or the organic solvent or photodegrading only the sacrificial layer present between the substrate in Step 1 and the polymer layer in Step 3 (Step 4). A schematic diagram illustrating a method of manufacturing a metal wiring buried flexible substrate step by step according to the present invention is illustrated in FIG. 1.

Hereinafter, the present invention will be described in detail step by step.

In the method of manufacturing the metal wiring buried flexible substrate according to the present invention, Step 1 corresponds to a step of coating a sacrificial layer including a polymer soluble in water or an organic solvent, or a photodegradable polymer on a substrate.

The substrate in Step 1 may include all kinds of substrates irrespective of a material such as a paper, a glass substrate, a metal substrata, a plastic substrate, etc. The sacrificial layer may be formed by using a polymer soluble in water such as polyvinyl alcohol, polyethylene glycol and carboxymethyl cellulose, and a polymer soluble in an organic solvent such as acetone, ethyl acetate, methanol, ethanol, chloroform, dichloromethane, hexane, benzene, diethyl ether, etc, and easily removable by the organic solvent, including polymethyl macruacrylata (PMMA) or a photosensitive polymer (photoresist, PR). In addition, the sacrificial layer may be formed by using a photodegradable polymer such as polycaprolactone, polylactic acid, etc.

The coating in Step 1 may be any coating methods conducted by means of a solution process including a spin coating, a dip coating, a doctor blading, a slit coating, an inkjet printing, an imprinting, etc., without limitations.

In the method of manufacturing the metal wiring buried flexible substrate according to the present invention, Step 2 corresponds to a step of forming a metal wiring on the sacrificial layer in Step 1. The metal wiring may be formed by coating a metal such as silver (Ag), copper (Cu), aluminum (Al), gold (Au), platinum (Pt), nickel (Ni), etc. or an alloy thereof. Alternatively, the metal wiring may be formed by coating or depositing one selected from the group consisting of indium tin oxide (ITO), indium zinc oxide (IZO), indium zinc tin oxide (IZTC), aluminum zinc oxide (AZO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO), aluminum zinc oxide-silver-aluminum zinc oxide (AZO-Ag-AZO), on the sacrificial layer by means of a printing, an electroplating, a vacuum depositing, a thermal depositing, a sputtering, an electron beam depositing method, etc.

In the method of manufacturing the metal wiring buried flexible substrate according to the present invention, Step 3 corresponds to a step of forming a metal wiring buried polymer layer by coating a curable polymer on the sacrificial layer including the metal wiring formed thereon in Step 2 and curing. The curable polymer in Step 3 may be one selected from the group consisting of polyethylene terephthalate (PET), polyethylene sulfone (PES), polyethylene naphthalate (PEN), polycarbonate (PC), polymethyl methacrylate (PMMA), polyimide (PT), ethylene vinyl acetate (EVA), amorphous polyethylne terephtalate (APET), polypropylene terephthalate (PPT), polyethylene terephtahalate glycerol (PETG), polycyclohexylene dimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polyarylate (PAR), polyether imide (PEI), polydimethyl siloxane (PDMS), a silicon resin, a fluorine resin, a modified epoxy resin, etc. The curable polymer may be coated on the metal wiring and then cured by an appropriate curing method for the polymer used such as a thermal curing, an ultraviolet curing, a moisture curing, a microwave curing, an infrared (IR) curing, etc. In this case, the coating may be conducted using a solution process including a doctor blading, a bar coating, a spin coating, a dip coating, a micro gravure, an imprinting, an inkjet printing, a spray method, etc., without limitation.

In the method of manufacturing the metal wiring buried flexible substrate according to the present invention. Step 4 corresponds to a step of separating the polymer layer in Step 3 from the substrate in Step 1 by removing through dissolving or photodegrading only the sacrificial layer present between the substrate in Step 1 and the polymer layer in Step 3.

The sacrificial layer/the metal wiring/the cured polymer layer are integrated one by one on one substrate after completing Step 3. The metal wiring and the cured polymer layer may be separated from the substrate by removing the sacrificial layer among the subsequently integrated layers. Accordingly, a flexible substrate manufactured by inserting the metal wiring in the polymer layer having flexibility may be obtained. The sacrificial layer may be easily removed by using an appropriate method according to the properties of the polymer used for the manufacture of the sacrificial layer. In addition, the metal wiring and the cured polymer layer may be separated from the substrate without generating any adverse influence. In the present invention, the removing method of the sacrificial layer may vary according to the kind of the sacrificial layer. In addition, since the material used for the sacrificial layer may not remain on the flexible substrate through removing only the sacrificial layer in Step 4, defects generated due to impurities of the remaining materials of the sacrificial layer may be prevented.

As described above, by burying the metal wiring in the flexible substrate, a wiring having a low resistance may be formed irrespective of the height of the metal wiring. In addition, since the metal wiring may be formed by a printing method, a vacuum deposition method, an electroplating method, a photolithography process, etc., the control of the shape of the wiring may be easy.

Meanwhile, the removing method of only the sacrificial layer in Step 4 may include a dipping of the substrate into water or an organic solvent and may include any methods possibly dissolving the sacrificial layer in water or in an organic solvent.

In addition, the removal of one photodegradable polymer may be conducted by exposing the substrate to a light. The light may be preferably an ultraviolet light and may be any lights without limitation.

In order to minimize the possibility of damaging the flexible substrate while removing the sacrificial layer in Step 4, an organic solvent including a lower alcohol such as methanol and ethanol may be preferably used, however may not be limited to these.

Figure 2:
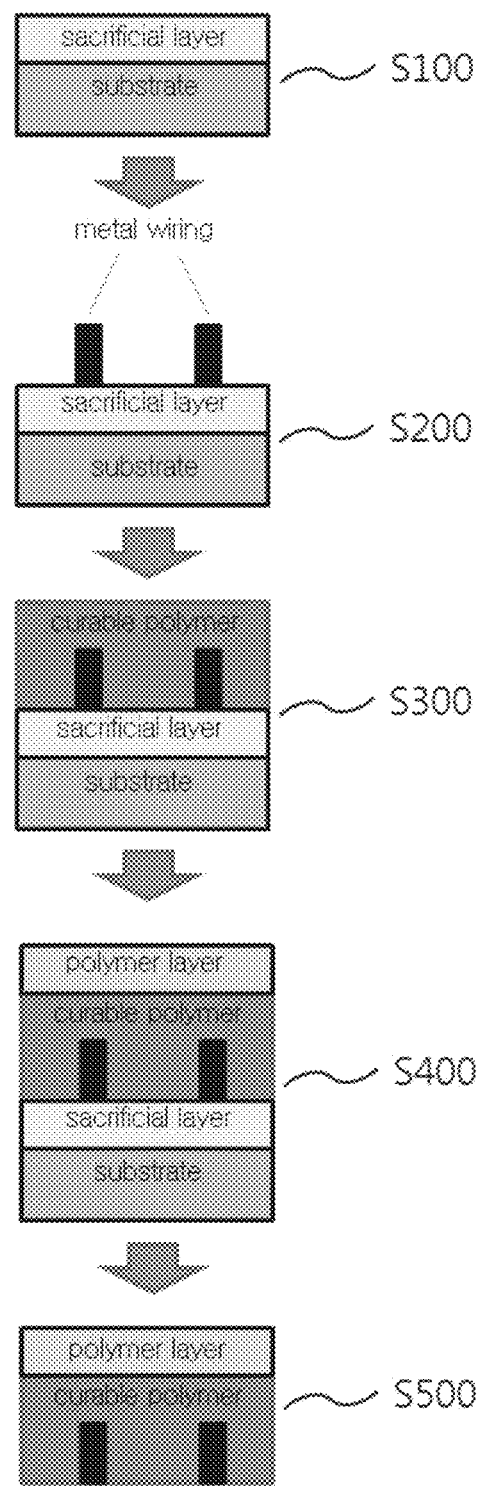

According the second aspect of the present invention, there is provided a method of manufacturing a metal wiring buried flexible substrate including:

coating a sacrificial layer including a polymer soluble in water or an organic solvent, or a photodegradable polymer on a substrate (Step 1);

forming a metal wising on the sacrificial layer in Step 1 (Step 2);

coating a curable polymer layer on the sacrificial layer including the metal wiring formed thereon in Step 2 (Step 3);

attaching a functional flexible substrate on the curable polymer layer in Step 3 and curing the curable polymer layer (Step 4); and separating the polymer layer attached to the functional flexible substrate in Step 4 from the substrate in Step 1 by removing through dissolving in the water or the organic solvent or photodegrading only the sacrificial layer present between the substrate in Step 1 and the polymer layer in Step 4 (Step 5). FIG. 2 illustrates schematic diagrams on a method of manufacturing a metal wiring buried flexible substrate step by step according to the present invention.

Hereinafter, the present invention will be described step by step in detail.

In the method of manufacturing the flexible substrate in this embodiment, the processes in Steps 1 to 3 are the same as the previously described processes and so, will be omitted.

In the method of manufacturing the metal wiring buried flexible substrate according to the second aspect of the present invention. Step 4 corresponds to a step of attaching a functional flexible substrate on the curable polymer layer in Step 3 and curing the curable polymer layer.

As the functional flexible substrate in Step 4, a polymer substrate such as a PET flexible substrate, a paper substrate, a metal substrate, etc. may be used. As the metal substrate, an STS substrate, an aluminum substrate, a copper substrate, etc. may be used. The surface of the functional flexible substrate in Step 4 may be coated with an ultraviolet shielding layer, a wavelength controlling layer, a light focusing layer, an antifouling layer or a moisture/oxygen permeation preventing layer to impart a complex effect to the flexible substrate with an ultraviolet shielding function, a wavelength transforming function, a focusing function (a lens function) of a visible light and an ultraviolet light, a preventing function on fingerprints and scratches, a preventing function on moisture and oxygen, etc. In addition, the surface of the functional flexible substrate in Step 4 may be texturing created to illustrate a specific pattern.

In the method of manufacturing a metal wiring buried flexible substrate according to the second aspect of the present invention. Step 5 corresponds to a step of separating the polymer layer attached to the functional flexible substrate in Step 4 from the substrate in Step 1 by removing through dissolving or photodegrading only the sacrificial layer present between the substrate in Step 1 and the polymer layer in Step 4.

After performing Step 4, the sacrificial layer/the metal wiring buried polymer layer/the functional flexible substrate are integrated on the substrate one by one. By removing the sacrificial layer among the subsequently integrated layers and substrates, the metal wiring buried polymer layer and the functional flexible substrate may be separated from the substrate. Accordingly, she flexible substrate combined with the functional substrate may be manufactured. The sacrificial layer may be easily removed by selecting an appropriate solvent or means according to the properties of the polymer used for forming the sacrificial layer, and the substrate may be separated without affecting the metal wiring and the cured polymer layer. In addition, since the materials used for the sacrificial layer may not remain, residual materials of the sacrificial layer may not act as impurities.

Meanwhile, the removing method of only the sacrificial layer in Step 5 may include a step of dipping the substrate dissolving the sacrificial layer using water or the organic solvent may be used.

In addition, the removal of the photodegradable polymer by irradiating a light may be conducted by irradiating the light onto the substrate. The light may be preferably an ultraviolet light but may include other lights without limitation.

Meanwhile, in order to minimise the damage onto the flexible substrate while removing the sacrificial layer in Step 5, a low alcohol such as methanol or ethanol may be preferably used as the organic solvent, however, the organic solvent may not be limited to these.

Figure 3:
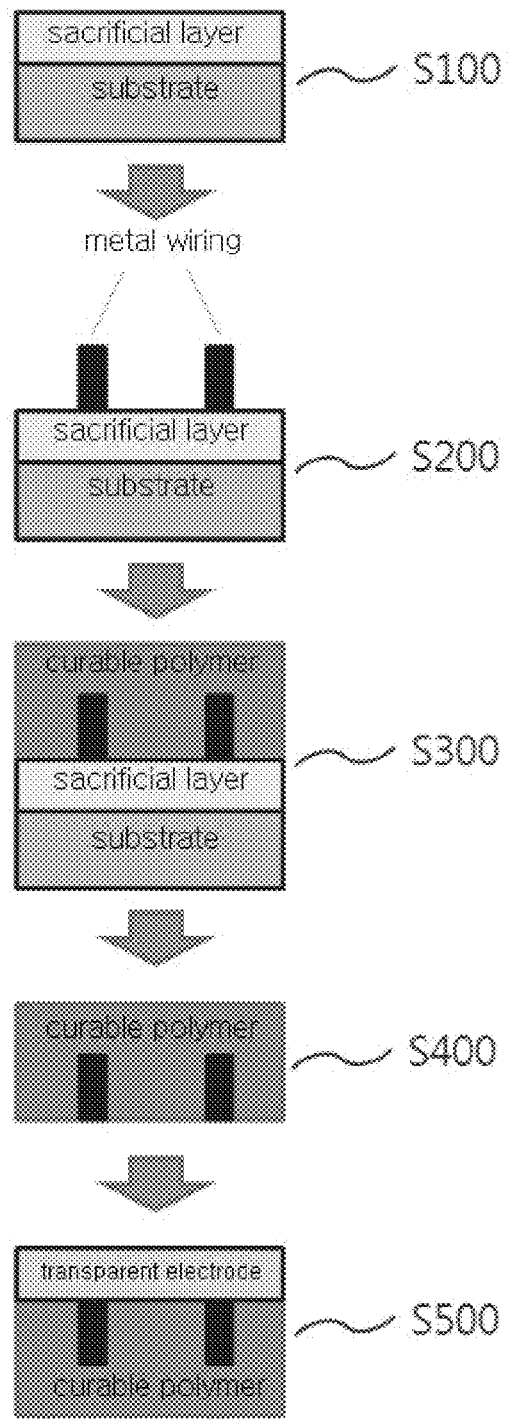

According the third aspect of the present invention, there is provided a method of manufacturing a metal wiring buried flexible substrate including:

coating a sacrificial layer including a polymer soluble in water or an organic solvent, or a photodegradable polymer on a substrate (Step 1);

forming a metal wiring on the sacrificial layer in Step 1 (Step 2);

forming a metal wiring buried polymer layer by coating a curable polymer on the sacrificial layer including the metal wiring formed thereon in Step 2 and curing (Step 3);

separating the polymer layer in Step 3 from the substrate in Step 1 by removing through dissolving in the water or the organic solvent or photodegrading only the sacrificial layer present between the substrate in Step 1 and the polymer layer in Step 3 (Step 4); and depositing or coating a transparent electrode on an exposed surface portion of the metal wiring of the separated polymer layer in Step 4 (Step 5). FIG. 3 illustrates schematic diagrams on a method of manufacturing a metal wiring buried flexible substrate step by step according to the present invention.

Hereinafter, the present invention will be explained step by step in detail.

In the method of manufacturing the flexible substrate according to the present invention, the processes in Steps 1 to 4 are the same as the previously explained processes, and will be omitted.

In the method of manufacturing the metal wiring buried flexible substrate according to the third aspect of the present invention. Step 5 corresponds to a step of depositing or coating a transparent electrode on the surface of an exposed portion of the metal wiring of the separated polymer layer in Step 4.

The transparent electrode in Step 5 may be formed by coating a metal oxide or a metal oxide-metal-metal oxide selected from the group consisting of indium thin oxide (ITO), indium zinc oxide (IZO), indium zinc tin oxide (IZTO), aluminum zinc oxide (AZO), gallium zinc oxide (GZO), fluorine tin oxide (FTO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO) and aluminum zinc oxide-silver-aluminum zinc oxide (AZO-Ag-AZO), or may be formed by using an organic conductive material such as PEDOT:PSS or polyaniline (PANI). The transparent electrode may be formed by using a metal thin film such as a silver thin film, a gold thin film, etc. having a thickness of about 10 to 20 nm and may be formed as a thin film obtained by coating a silver nanowire, a gold nanowire, a copper nanowire, a platinum nanowire, etc. having a diameter of about 5 to 100 nm. The transparent electrode may be formed by mixing at least one material selected from the materials described above. In addition, the transparent electrode may be formed by coating a carbon-based material such as a carbon nanotube, graphene, etc.

As described above, defects on increasing resistance as the transparent electrode becomes large-sized may be solved through combining the metal wiring buried flexible substrate with the transparent electrode. The flexible substrate may be applied to an electronic device requiring flexibility including a solar battery, a display, etc.

Meanwhile, in the method of manufacturing the metal wiring buried flexible substrate according to the third aspect of the present invention, a step of curing after attaching the functional flexible substrate onto the polymer layer may be further included before separating the polymer layer from the substrate.

As the functional flexible substrate, a polymer substrate such as a PET flexible substrate, a paper substrate, a metal substrate may be used. As the metal substrate, an STS substrate, an aluminum substrate, a copper substrate, etc. may be used. The surface of the functional flexible substrate may be coated with an ultraviolet shielding layer, a wavelength controlling layer, a light focusing layer, an antifouling layer or a moisture/oxygen permeation preventing layer to impart the properties thereof to the flexible substrate. In addition, the surface of the functional flexible substrate may be texturing treated to illustrate a specific pattern.

Figure 4:
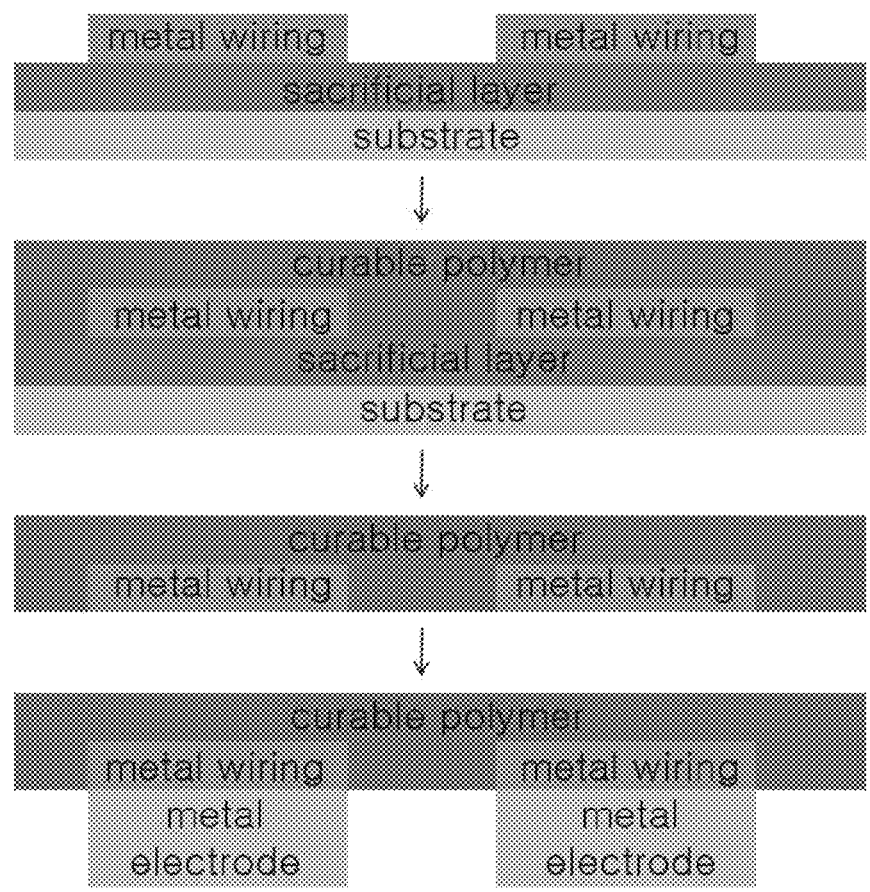
Figure 5:
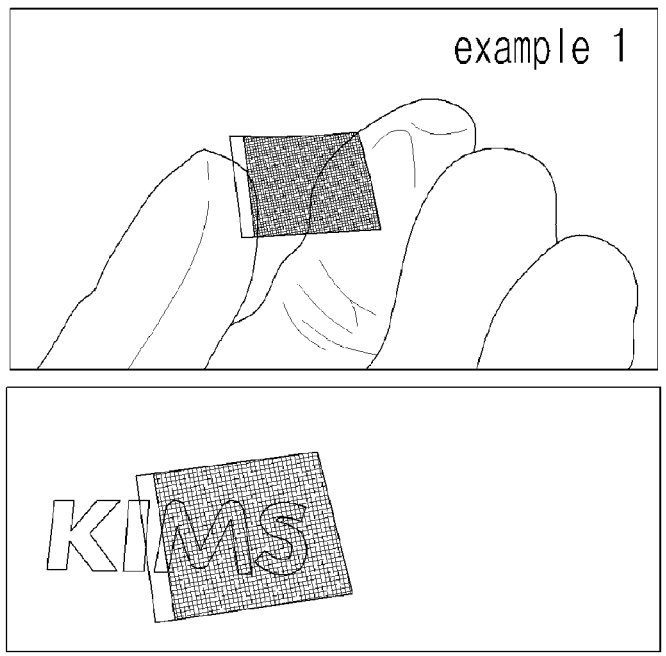
FIGS. 5 to 11 are photographs on flexible substrates manufactured according to the method of the present invention.
Figure 6:
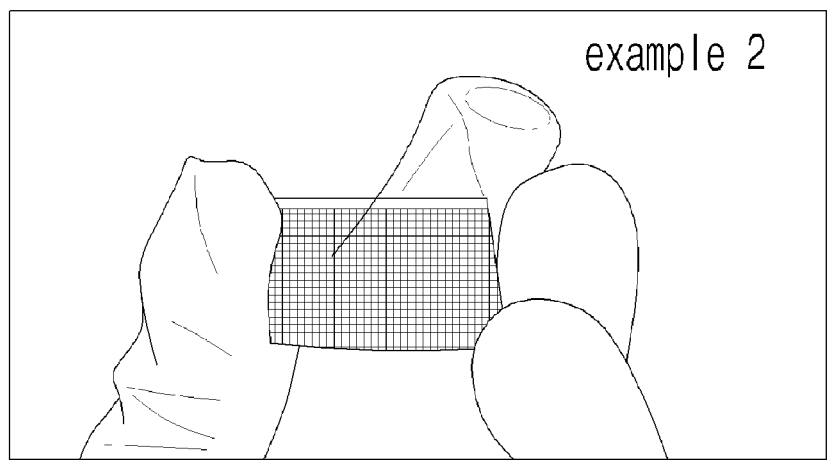
Figure 7:
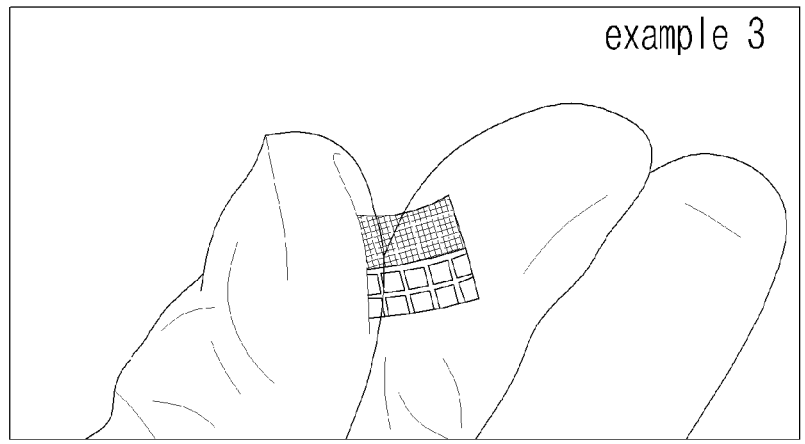
Figure 8:
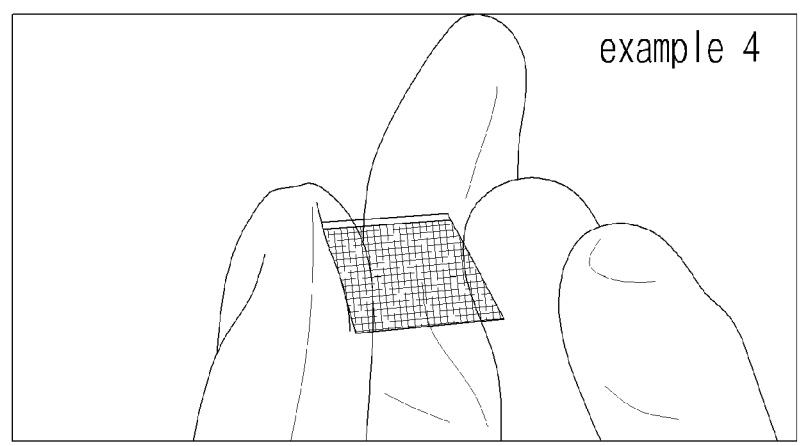
Figure 9:
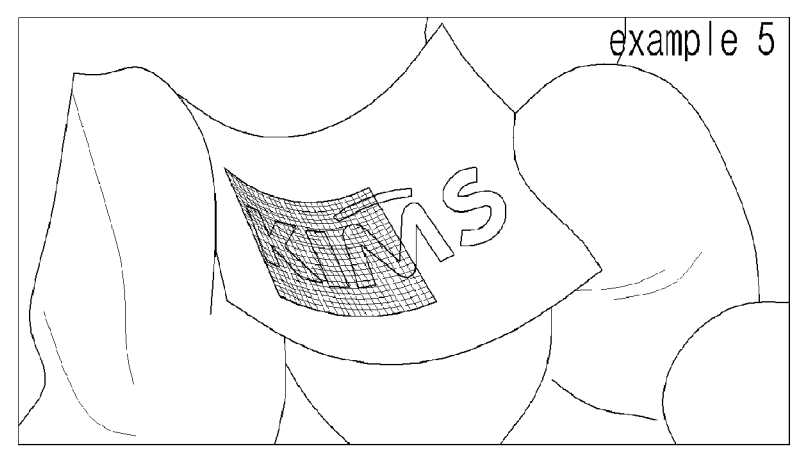
Figure 10:
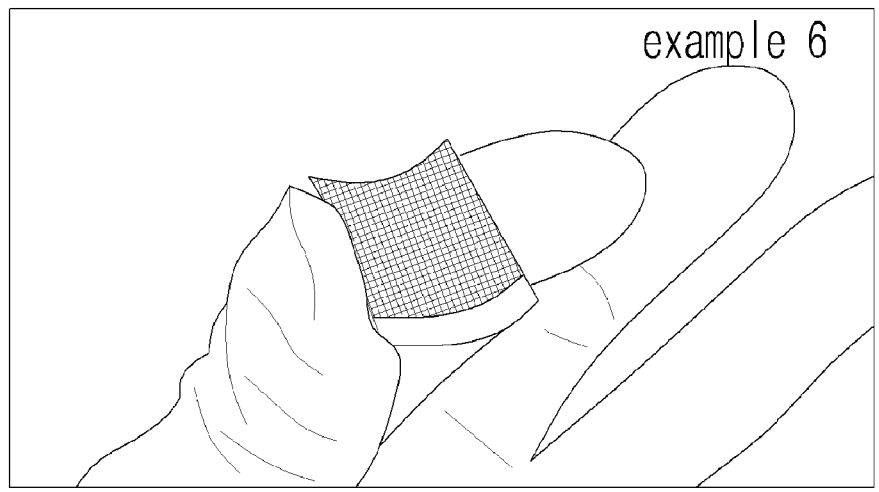
Figure 11:
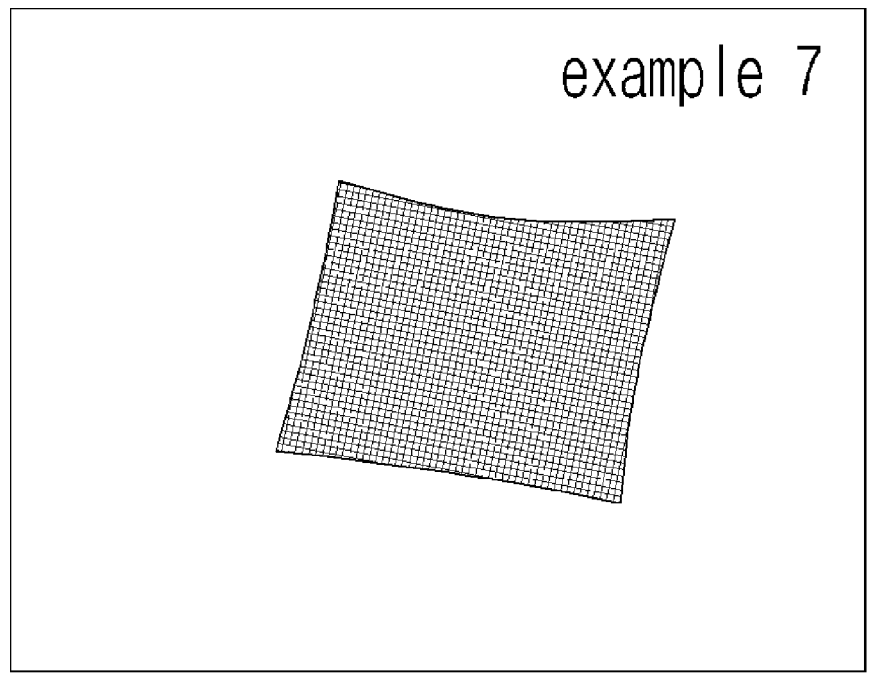

According the fourth aspect of the present invention, there is provided a method of manufacturing a metal wiring buried flexible substrate including:

coating a sacrificial layer including a polymer soluble in water or an organic solvent, or a photodegradable polymer on a substrate (Step 1);

forming a metal wiring on the sacrificial layer in Step 1 (Step 2);

forming a metal wiring buried polymer layer by coating a curable polymer on the sacrificial layer including the metal wiring formed thereon in Step 2 and curing (Step 3);

separating the polymer layer in Step 3 from the substrate in Step 1 by removing through dissolving in the water or the organic solvent or photodegrading only the sacrificial layer present between the substrate in Step 1 and the polymer layer in Step 3 (Step 4); and electroplating a metal electrode on an exposed surface portion of the metal wiring of the separated polymer layer from the substrate in Step 4 (Step 5). FIG. 4 illustrates schematic diagrams on a method of manufacturing a metal wiring buried flexible substrate step by step according to the present invention.

In the method of manufacturing the flexible substrate according to the present invention, processes in Steps 1 to 4 are one same as the processes described above, and will be omitted.

In the method of manufacturing the metal wiring buried flexible substrate according to the fourth aspect of the present invention, Step 5 corresponds to a step of electroplating a metal electrode on the surface of an exposed portion of the metal wiring of the separated polymer layer in Step 4. According to the separation of the polymer layer from the substrate, the metal wiring may be exposed to the surface of the flexible substrate including the metal wiring buried in the polymer layer. The metal electrode making a contact with the metal wiring exposed to the surface of the flexible substrate in Step 5 may be electroplated. Through conducting the electroplating, the conductivity of the buried metal wiring may be increased.

In this case, the metal electrode may be formed by electroplating a conductive metal such as copper (Cu), nickel (Ni), silver (Ag), gold (Au), tin (Sn), chromium (Cr) and zinc (Zn) in Step 5. The metal electrode formed by using the conductive metal may increase the conductivity of the flexible substrate.

Meanwhile, the method of manufacturing the metal wiring buried flexible substrate according to the fourth aspect of the present invention may further include a step of attaching a functional flexible substrate onto the polymer layer and curing before separating the polymer layer from the substrate.

As the functional flexible substrate, a polymer substrate such as a PET flexible substrate, a paper substrate, a metal substrate, etc. may be used. As the metal substrate, an STS substrate, an aluminum substrate, a copper substrate, etc. may be used. The surface of the functional flexible substrate may be coated with an ultraviolet shielding layer, a wavelength controlling layer, a light focusing layer, an antifouling layer, a moisture/oxygen permeation preventing layer, etc, to impart the properties thereof to the flexible substrate. In addition, the surface of the functional flexible substrate may be texturing treated to illustrate a specific pattern.

According the fifth aspect of the present invention, there is provided a method of manufacturing a metal wiring buried flexible substrate including:

coating a separating layer on a substrate (Step 1);
coating a sacrificial layer including a polymer soluble in water or an organic solvent, or a photodegradable polymer on the separating layer in Step 1 (Step 2);
forming a metal wiring on the sacrificial layer in Step 2 (Step 3);
forming a metal wiring buried polymer layer by coating a curable polymer on the sacrificial layer including the metal wiring formed thereon in Step 3 and curing (Step 4);
removing the substrate and the separating layer in Step 1 by applying a physical force (Step 5); and
removing only the sacrificial layer exposed after removing the substrate in Step 1 by performing Step 5 through dissolving in the water or in the organic solvent or through photodegrading the sacrificial layer (Step 6).

According the sixth aspect of the present invention, there is provided a method of manufacturing a metal wiring buried flexible substrate including:

coating a separating layer on a substrate (Step 1);
coating a sacrificial layer including a polymer soluble in water or an organic solvent, or a photodegradable polymer on the coated separating layer in Step 1 (Step 2);
forming a metal wiring on the sacrificial layer in Step 2 (Step 3);
forming a curable polymer layer on the sacrificial layer including the metal wiring formed thereon in Step 3 and curing (Step 4);
attaching a functional flexible substrate on the curable polymer layer in Step 4 and curing the curable polymer layer (Step 5);
removing the substrate and the separating layer in Step 1 by applying a physical force (Step 6); and
removing only the sacrificial layer exposed after removing the substrate in Step 1 by performing Step 6 through dissolving in the water or in the organic solvent or through photodegrading the sacrificial layer (Step 7).

According the seventh aspect of the present invention, there is provided a method of manufacturing a metal wiring buried flexible substrate including;

coating a separating layer on a substrate (Step 1);
coating a sacrificial layer including a polymer soluble in water or an organic solvent, or a photodegradable polymer on the coated separating layer in Step 1 (Step 2);
forming a metal wiring on the sacrificial layer in Step 2 (Step 3);
forming a metal wiring buried polymer layer by coating a curable polymer on the sacrificial layer including the metal wiring formed thereon in Step 3 and curing (Step 4);
removing the substrate and the separating layer in Step 1 by applying a physical force (Step 5);
removing only the sacrificial layer exposed after removing the substrate in Step 1 by performing Step 5 through dissolving in the water or in the organic solvent or through photodegrading the sacrificial layer (Step 7); and
depositing or coating a transparent electrode on an exposed surface portion of the metal wiring after removing the sacrificial layer in Step 6 (Step 7).

According the eighth aspect of the present invention, there is provided a method of manufacturing a metal wiring buried flexible substrate including:

coating a separating layer on a substrate (Step 1);
coating a sacrificial layer including a polymer soluble in water or an organic solvent, or a photodegradable polymer on the coated separating layer in Step 1 (Step 2);
forming a metal wiring on the sacrificial layer in Step 2 (Step 3);
forming a metal wiring buried polymer layer by coating a curable polymer on the sacrificial layer including the metal wiring formed thereon in Step 3 and curing (Step 4);
removing the substrate and the separating layer in Step 1 by applying a physical force (Step 5);
removing only the sacrificial layer exposed after removing the substrate in Step 1 by performing Step 5 through dissolving in the water or in the organic solvent or through photodegrading the sacrificial layer (Step 7); and
electroplating a metal electrode on an exposed surface portion of the metal wiring after removing the sacrificial layer in Step 6 (Step 7).

According to the method of manufacturing the metal wiring buried flexible substrate in the fifth to eighth aspects of the present invention, a separating layer may be coated on a substrate and then the substrate may be separated by applying a physical force. A sacrificial layer may be removed by dissolving in water or an organic solvent or by photodegrading the exposed portion of the sacrificial layer after the separation of the substrate. Through exposing the sacrificial layer using the separating layer, the area of the sacrificial layer for making a contact with wafer or an organic solvent or with a light such as an ultraviolet light may be increased. In this case, the removal of the sacrificial layer may be easily conducted in a short time.

Meanwhile, the process may be the same as described above except for conducting coating the separating layer, removing the substrate and the separating layer by applying a physical force, and removing the sacrificial layer to manufacture a metal wiring buried flexible substrate. Thus, an explanation on the process may be omitted.

According to the present invention, there is provided a metal wiring buried flexible substrate manufactured by the above described method, in which a polymer layer and a metal wiring are integrated one by one, and the metal wiring is provided in the polymer layer.

Since the metal wiring buried flexible substrate according to the present invention is manufactured by the method as described above, the metal wiring may be present in a buried state in the polymer layer. In this case, for the metal wiring buried flexible substrate according to the present invention, materials used as the sacrificial layer may not remain on the surface of the metal wiring and the polymer layer.

Commonly, in order to manufacture a metal wiring in a buried state, a separating material such as diamond like carbon (DLC), etc. has been used to solve defects concerning the residues of a separating material as impurities or the damage of the metal wiring. When a common separating material is used, the pattern of the metal, wiring may be damaged and the original shape of the metal wiring may not be maintained. Sometimes, since the separating material may remain on the metal wiring and the flexible substrate as impurities, an application of the substrate in a recently developed electronic device such as a display, a solar battery, etc. may become difficult.

On the other hand, the metal wiring buried flexible substrate according to the present invention may be manufactured excluding residual impurities by completely removing the material used as the sacrificial layer. Accordingly, the flexible substrate according to the present invention may be used as a substrate of a solar battery, a flat lighting, an e-paper, a touch panel or a display.

In addition, the flexible substrate may be used as an auxiliary electrode of a material for a printed wiring board (PCS), a solar battery substrate, a displaying substrate, a radio frequency identification (RFID) substrate, a substrate for a sensor or a substrate for a secondary battery, and may be applied in all electronic devices requiring a flexible substrate.

MODE FOR CARRYING OUT THE INVENTION

Hereinafter, the present invention will be described in more detail through example embodiments. However, the following examples are illustrated only for the explanation of the present invention and will not limit the scope of the present invention, Example 1

Manufacture of a Metal Wiring Buried Flexible Substrate 1

Step 1: After cleaning a glass substrate using acetone and isopropyl alcohol, an $O_2$ plasma treatment (process condition: treatment at an $O_2$ gas of 1 sccm, a process pressure of 10 mTorr, and a DC power of 500 W for 300 seconds) was conducted to modify the surface of the substrate to have a hydrophilic property. Into distilled water, polyvinyl alcohol (PVA, molecular weight: 90,000-120,000, 99% Sigma-Aldrich) was added by 10 wt % concentration to prepare a polyvinyl alcohol solution. This polyvinyl alcohol solution was coated on the glass substrate by a spin coating method (1,000 rpm for 50 seconds). After completing the coating, a thermal treatment was conducted on a hot-plate at 90° C. for 5 minutes to form a sacrificial layer having a thickness of about 700 nm.

Step 2: By using a gravure offset printing apparatus, an Ag paste (silver nano paste DGP, nano new material (ANP)) was coated on the sacrificial layer formed in Step 1 to form an Ag wiring having a line width of 20 to 500 µm and an interval of 20 to 2,000 µm. The thus formed wiring was heat treated on a hot-plate of 200° C. for 1 hour. After performing the heat treatment, the thickness of the Ag wiring was about 1 to 4 µm.

Step 3: On the Ag wiring formed in Step 2, an ultraviolet (UV)-curable polymer (NOA74: norland optical adhesives 74) was coated so a liquid state film having a certain thickness by means of a doctor blading method and was cured by irradiating the ultraviolet light having a wavelength of 365 nm, to form a polymer layer having a thickness of 2 to 400 µm.

Step 4: After completing the process of Step 3, the substrate was dipped into water to dissolve out the sacrificial layer formed in Step 1 and to separate the polymer layer from the substrate manufactured in Step 3 and to form an Ag wiring buried flexible substrate.

Example 2

Manufacture of a Metal Wiring Buried Flexible Substrate 2

Step 1: After cleaning a glass substrate using acetone and isopropyl alcohol, an $O_2$ plasma treatment (process condition; treatment at an $O_2$ gas of 1 sccm, a process pressure of 10 mTorr, and a DC power of 500 W for 300 seconds) was conducted to modify the surface of the substrate to have a hydrophilic property. Into distilled water, polyvinyl alcohol (PVA, molecular weight: 90,000-120,000, 99%, Sigma-Aldrich) was added by 10% concentration to prepare a polyvinyl alcohol solution. This polyvinyl alcohol solution was coated on the glass substrate by a spin coating method (1,000 rpm for 60 seconds). After completing the coating, a thermal treatment was conducted on a hot-plate at 90° C. for 5 minutes to form a sacrificial layer having a thickness of about 700 nm.

Step 2: By using a gravure offset printing apparatus, an Ag paste (silver nano paste DGP, nano new material (ANP)) was coated on the sacrificial layer formed in Step 1 to form an Ag wiring having a line width of 20 to 500 µm and an interval of 20 to 2,000 µm. The thus formed wiring was heat treated on a hot-plate of 200° C. for 1 hour. After performing the heat treatment, the thickness of the Ag wiring was about 1 to 4 µm.

Step 3: On the Ag wiring formed in Step 2, a UV-curable polymer (NCA74: norland optical adhesives 74) was coated to a liquid state polymer layer having a thickness of 2 to 400 µm by means of a doctor blading method.

Step 4: On the coated polymer layer in Step 3, a PET flexible substrate was put, and the substrate was rolling treated by a certain weight to remove the bubbles inside and to uniformly attach the PET flexible substrate to the polymer layer. After attaching the PET flexible substrate, an ultraviolet light having a wavelength of 365 nm was irradiated to cure the curable polymer layer.

Step 5: After completing the process of Step 4, the substrate was dipped into water to dissolve out the sacrificial layer formed in Step 1, to separate the polymer layer and the substrate manufactured in Step 4 and to form a metal wiring buried flexible substrate.

Example 3

Manufacture of a Metal Wiring Buried Flexible Substrate 3

A metal wiring buried flexible substrate was manufactured by conducting the same procedure explained in Example 2 except for attaching a polyimide flexible substrate onto the polymer layer in Step 4 in Example 2.

Example 4

Manufacture of a Metal Wiring Buried Flexible Substrate 4

A metal wiring buried flexible substrate was manufactured by conducting the same procedure explained in Example 2 except for attaching a microlens patterned functional flexible substrate onto the polymer layer in Step 4 in Example 2.

Example 5

Manufacture of a Metal Wiring Buried Flexible Substrate 5

A metal wiring buried flexible substrate was manufactured by conducting the same procedure explained in Example 2 except for attaching a paper flexible substrate onto the polymer layer in Step 1 in Example 2.

Example 6

Manufacture of a Metal Wiring Buried Flexible Substrate 6

A metal wiring buried flexible substrate was manufactured by conducting the same procedure explained in Example 2 except for attaching an aluminum (Al) flexible substrate onto the polymer layer in Step 4 in Example 2.

Example 7

Manufacture of a Metal Wiring Buried Flexible Substrate 7

A metal wiring buried flexible substrate was manufactured by conducting the same procedure explained in Example 2 except for attaching an STS flexible substrate on she polymer layer in Step 4 in Example 2.

Example 8

Manufacture of a Metal Wiring Buried Flexible Substrate 8

Step 1: Octadecyltrichlorosilane (OTS) was coated as a Si-based separating layer on a glass substrate.
Step 2: Into distilled water, polyvinyl alcohol (PVA, molecular weight: 90,000-120,000, 99%, Sigma-Aldrich) was added by 10 wt % concentration to prepare a polyvinyl alcohol solution. This polyvinyl alcohol solution was coated on the OTS separating layer by a spray coating method. After completing the coating, a thermal treatment was conducted on a hot-plate at 90° C. for 5 minutes to form a sacrificial layer having a thickness of about 0.5 to 2 µm.
Step 3: By using a gravure offset printing apparatus, as Ag paste (silver nano paste DGP, nano new material (ANP)) was coated on the sacrificial layer formed in Step 2 to form an Ag wiring having a line width of 20 to 500 µm and an interval of 20 to 2,000 µm. The thus formed wiring was heat treated on a hot-plate of 200° C. for 1 hour. After performing the heat treatment, the thickness of the Ag wiring was about 1 to 4 µm.
Step 4: On the Ag wiring formed in Step 3, UV-curable polymer (NOA74: norland optical adhesives 74) was coated to a liquid state film having a certain thickness by means of a doctor blading method and cured by irradiating an ultraviolet light having a wavelength of 365 nm to form a polymer layer having a thickness of 2 to 400 µm.
Step 5: The sacrificial layer was separated from the separating layer by applying a physical force onto the glass substrate in Step 1, and the sacrificial layer was dissolved out in water to separate the polymer layer and the substrate formed in Step 4 and to manufacture an Ag wiring buried flexible substrate.

Example 9

Manufacture of a Metal Wiring Buried Flexible Substrate 9

Step 1: After cleaning a glass substrate using acetone and isopropyl alcohol, an $O_2$ plasma treatment (process condition; treatment at an $O_2$ gas of 1 sccm, a process pressure of 10 mTorr, and a DC power of 500 W for 300 seconds) was conducted to modify the surface of the substrate to have a hydrophilic property. Into distilled water, polyvinyl alcohol (PVA, molecular weight: 90,000-120,000, 99%, Sigma-Aldrich) was added by 10 wt % concentration to prepare a polyvinyl alcohol solution. This polyvinyl alcohol solution was coated on the glass substrate by a spin coating method (1,000 rpm for 6 seconds). After completing the coating, a thermal treatment was conducted on a hot-plate at 90° C. for 5 minutes to form a sacrificial layer having a thickness of about 700 nm.
Step 2: By using a gravure offset printing apparatus, an Ag paste (silver nano paste DGP, nano new material (ANP)) was coated on the sacrificial layer formed in Step 1 to form an Ag wiring having a line width of 20 µm and an interval of 1,000 µm. The thus formed wiring was heat treated on a hot-plate of 200° C. for 1 hour. After performing the heat treatment, the thickness of the Ag wiring was about 1 to 4 µm.
Step 3: On the Ag wiring formed in Step 2, a UV-curable polymer (NOA74: norland optical adhesives 74) was coated to a liquid state film having a certain thickness by means of a doctor blading method and cured by irradiating an ultraviolet light having a wavelength of 365 nm to form a polymer layer having a thickness of 2 to 400 µm.
Step 4: After completing the process of Step 3, the substrate was dipped into water to dissolve out the sacrificial layer formed in Step 1 to separate the polymer layer and the substrate manufactured in Step 3 and to form an Ag wiring buried flexible substrate.
Step 5: On the Ag wiring buried flexible substrate formed in Step 4, a conductive polymer PEDOT:PSS (PH1000, CLEVIOS™) was coated by using a spray coating apparatus to form a transparent electrode and to manufacture a transparent electrode substrate combined with a metal wiring. The coating solution was prepared by adding and mixing dimethyl sulfoxide (DMSO) in a mixing ratio of 5 wt % in the PEDOT:PSS. The spray coating condition was as follows. The PEDOT:PSS solution was injected to a spray nozzle through a micro pump in a flowing rate of 200 m/min, and an argon (Ar) gas was injected with a pressure of 50 psi to spray the solution from the nozzle to perform the coating onto the flexible substrate. In this case, the distance between the nozzle and the substrate was 8 cm, the nozzle velocity was 1,800 cm/min, and the substrate velocity was 6 cm/min, and the coating to form a transparent electrode having a thickness of 147 nm.

Example 10

Manufacture of a Metal Wiring Buried Flexible Substrate 10

A transparent electrode substrate combined with a metal wiring was manufactured by conducting the same procedure described in Example 3 except for forming an Ag wiring having a line width of 20 µm and an interval of 2,000 µm by coating the Ag paste (silver nano paste DGP, nano new material (ANP)) on the sacrificial layer in Step 2 in Example 9.

Example 11

Manufacture of a Metal Wiring Buried Flexible Substrate 11

Step 1: After cleaning a glass substrate using acetone and isopropyl alcohol, an $O_2$ plasma treatment (process condition; treatment at an $O_2$ gas of 1 sccm, a process pressure of 10 mTorr, and a DC power of 500 W for 300 seconds) was conducted to modify the surface of the substrate to have a hydrophilic property. Into distilled water, polyvinyl alcohol (PVA, molecular weight: 90,000-120,000, 99%, Sigma-Aldrich) was added by 10 wt % concentration to prepare a polyvinyl alcohol solution. This polyvinyl alcohol solution was coated on the glass substrate by a spin coating method (1,000 rpm for 60 seconds). After completing the coating, a thermal treatment was conducted on a hot-plate at 90° C. or 5 minutes to form a sacrificial layer having a thickness of about 700 nm.

Step 2: By using a gravure offset printing apparatus, an Ag paste (silver nano paste DGP, nano new material (ANP)) was coated on the sacrificial layer formed in Step 1 to form an Ag wiring having a line width of 40 µm and an interval of 2,000 µm. The thus formed wiring was heat treated on a hot-plate of 200° C. for 1 hour. After performing the heat treatment, the thickness of the Ag wiring was about 1 to 4 µm.

Step 3: On the Ag wiring formed in Step 2, a UV-curable polymer (NOA74: norland optical adhesives 74) was coated to a liquid state film having a certain thickness by means of a doctor blading method and cured by irradiating an ultraviolet light having a wavelength of 365 nm to form a polymer layer having a thickness of 2 to 400 µm.

Step 4: After completing the process of Step 3, the substrate was dipped into water to dissolve out the sacrificial layer formed in Step 1 to separate the polymer layer and the substrate manufactured in step 3 and to form an Ag wiring buried flexible substrate.

Step 5: On the Ag wiring buried flexible substrate formed in Step 4, an indium tin oxide (ITO) target was deposited by a magnetron sputtering method to form an ITO transparent electrode and to manufacture a transparent electrode substrate combined with a metal wiring. The process condition was as follows. An initial vacuum degree was 2.4E-6 torr, a process pressure was 1.2E-3 torr, an argon gas was injected by 30 sccm, an oxygen gas was injected by 0.3 sccm, and a DC of 0.25 kV and an RF power of 50 W were applied. The process was conducted for 1 minute to deposit the ITO transparent electrode having a thickness of 20 nm.

Example 12

Manufacture of a Metal Wiring Buried Flexible Substrate 12

Step 1: After cleaning a glass substrate using acetone and isopropyl alcohol, an $O_2$ plasma treatment (process condition: treatment at an $O_2$ gas of 1 sccm, a process pressure of 10 mTorr, and a DC power of 500 W for 300 seconds) was conducted to modify the surface of the substrate to have a hydrophilic property. Into distilled water, polyvinyl alcohol (PVA, molecular weight; 90,000-120,000, 99%, Sigma-Aldrich; was added by 10 wt % concentration to prepare a polyvinyl alcohol solution. This polyvinyl alcohol solution was coated on the glass substrate by a spin coating method (1,000 rpm for 60 seconds). After completing the coating, a thermal treatment was conducted on a hot-plate at 90° C. for 5 minutes to form a sacrificial layer having a thickness of about 700 nm.

Step 2: An Ag paste (silver nano paste DGP, nano new material (ANP)) and butyl carbitol were diluted in a ratio of 2:1 and thus obtained solution was printed on the sacrificial layer formed in Step 1 to form an Ag wiring having a line width of 12 to 14 µm and an interval of 2,000 µm by using an aerosol jet coating apparatus (OPTOMEC Co., process condition: a nozzle of 100 µm, a sheath of 24 sccm, an impactor of 450 sccm, an atomizer of 500 sccm and a printing velocity of 2 mm/sec). The thus formed wiring was heat treated on a hot-plate of 200 to 250° C. for 1 hour. After performing the heat treatment, the thickness of the Ag wiring was about 0.1 to 2 µm.

Step 3: On the Ag wiring formed in Step 2, a UV-curable polymer (NOA74: norland optical adhesives 74) was coated to a liquid state film having a certain thickness by means of a doctor blading method and cured by irradiating an ultraviolet light having a wavelength of 365 nm to form a film having a thickness of 2 to 400 µm.

Step 4: After completing the process of Step 3, the substrate was dipped into water to dissolve out the sacrificial layer formed in Step 1 to separate the polymer layer and the substrate manufactured in Step 3 and to form an Ag wiring buried flexible substrate.

Step 5: On the Ag wiring buried flexible substrate formed in Step 4, an indium tin oxide (ITO) target was deposited by a magnetron sputtering method to form an ITO transparent electrode and to manufacture a transparent electrode substrate combined with a metal wiring. The process condition was as follows. An initial vacuum degree was 2.4E-6 torr, a process pressure was 1.2E-3 torr, an argon gas was injected by 30 sccm, an oxygen gas was injected by 0.3 sccm, and a DC of 0.25 kV and an RF power of 50 W were applied. The process was conducted for 1 minute to deposit the ITO transparent electrode having a thickness of 20 nm.

Example 13

Manufacture of a Metal Wiring Buried Flexible Substrate 12

Step 1: After cleaning a glass substrate using acetone and isopropyl alcohol, an $O_2$ plasma treatment (process condition; treatment at an O₂ gas of 1 sccm, a process pressure of 10 mTorr, and a DC power of 500 W for 300 seconds) was conducted to modify the surface of the substrate to have a hydrophilic property. Into distilled water, polyvinyl alcohol (PVA, molecular weight: 90,000-120,000, 99%, Sigma-Aldrich) was added by 10 wt % concentration to prepare a polyvinyl alcohol solution. This polyvinyl alcohol solution was coated on the glass substrate by a spin coating method (1,000 rpm for 60 seconds). After completing the coating, a thermal treatment was conducted on a hot-plate at 90° C. for 5 minutes to form a sacrificial layer having a thickness of about 700 nm.

Step 2: By using a gravure offset printing apparatus, an Ag paste (silver nano paste DGP, nano new material (ANP)) was coated on the sacrificial layer formed in Step 1 to form an Ag wiring having a line width of 20 to 500 μm and an interval of 20 to 2,000 μm. The thus formed wiring was heat treated on a hot-plate of 200° C. for 1 hour. After performing the heat treatment, the thickness of the Ag wiring was about 1 to 2 μm.

Step 3: On the Ag wiring formed in Step 2, a UV-curable polymer (NOA74: norland optical adhesives 74) was coated to a liquid state film having a certain thickness by means of a doctor blading method and cured by irradiating an ultraviolet light having a wavelength of 365 nm to form a polymer layer having a thickness of 2 to 400 μm.

Step 4: After completing the process of Step 3, the substrate was dipped into water to dissolve out the sacrificial layer formed in Step 1 to separate the polymer layer and the substrate manufactured in Step 3 and to form an Ag wiring buried flexible substrate.

Step 5: On the exposed surface of the Ag wiring buried flexible substrate formed in Step 4, a copper electrode was formed through an electroplating method to manufacture a flexible substrate including a metal wiring electroplated with the copper electrode. In this case, the electroplating condition for forming the copper electrode was as follows. Into 1 L of an aqueous solution, 200 g of $Cu_2SO_4$, 60 mL of $H_2SO_4$ and a 50 ppm of HCl solution were added to prepare an electroplating solution. By applying current of 400 mA/cm² for 5 to 60 minutes using the copper electrode as an anode and the sample (Ag wiring buried flexible substrate) as a cathode, a copper electrode having a thickness of 0.1 to 10 μm was manufactured.

Example 14

Manufacture of a Metal Wiring Buried Flexible Substrate 14

Into distilled water, polyvinyl alcohol (PVA, molecular weight: 90,000-120,000, 99%, Sigma-Aldrich) was added by 10 wt % concentration to prepare a polyvinyl alcohol solution. This polyvinyl alcohol solution was coated on the glass substrate by a spin coating method (1,000 rpm for 60 seconds). After completing the coating, a thermal treatment was conducted on a hot-plate at 90° C. for 5 minutes to form a sacrificial layer having a thickness of about 700 nm.

Step 2: After coating an Ag paste (silver nano paste DGF, nano new material (ANP)) on the sacrificial layer formed in Step 1, a heat treatment was conducted at 250° C. for 46 hours to form a metal wiring.

Step 3: After dissolving PES in DMSO by 30 wt % ratio, the thus obtained solution was coated on the metal wiring formed in Step 2 by a doctor blading method to a thickness of 15 μm. Then, heat treatment was conducted at 180° C. for 10 minutes to manufacture a metal wiring buried PES flexible substrate.

Step 4: After completing the process of Step 3, the substrate was dipped into waver to dissolve out the sacrificial layer formed in Step 1 to separate the polymer layer and the substrate manufactured in Step 3 and to form an Ag wiring buried flexible substrate.

Example 15

Manufacture of a Metal Wiring Buried Flexible Substrate 15

Step 1: A fluorine resin of polytetrafluoroethylene (PTFE) was coated on a glass substrate.

Step 2: Into distilled water, polyvinyl alcohol (PVA, molecular weight: 30,000-120,000, 99%, Sigma-Aldrich) was added by 10 wt % concentration to prepare a polyvinyl alcohol solution. This polyvinyl alcohol solution was coated on the coated polytetrafluoroethylene layer formed in Step 1 by a spin coating method. After completing the coating, a thermal treatment was conducted on a hot-plate at 90° C. for 5 minutes to form a sacrificial layer having a thickness of about 0.5 to 2 μm.

Step 3: By using a gravure offset printing apparatus, an Ag paste (silver nano paste DGP, nano new material (ANP)) was coated on the sacrificial layer formed in Step 2 to form an Ag wiring having a line width of 20 to 500 μm and an interval of 20 to 2,000 μm. The thus formed Ag wiring was heat treated on a hot-plate of 200° C. for 1 hour. After performing the heat treatment, the thickness of the Ag wiring was about 1 to 4 μm.

Step 4: On the Ag wiring formed in Step 3, a UV-curable polymer (NOA74: norland optical adhesives 74) was coated to a liquid state film having a certain thickness by means of a light having a wavelength of 365 nm to form a polymer layer having a thickness of 2 to 400 μm.

Step 5: Onto the glass substrate in Step 1, a physical force was applied to separate the sacrificial layer from the polytetrafluoroethylene layer. Then, the sacrificial layer was dissolved out to separate the polymer layer and the substrate manufactured in Step 4 and to manufacture an Ag wiring buried flexible substrate.

Example 16

Manufacture of a Metal Wiring Buried Flexible Substrate 16

Step 1: Octadecyltrichlorosilane (OTS) was coated as a Si-based separating layer on a glass substrate.

Step 2: Into distilled water, polyvinyl alcohol (PVA, molecular weight: 30,000-120,000, 99%, Sigma-Aldrich) was added by 10 wt % concentration to prepare a polyvinyl alcohol solution. This polyvinyl alcohol solution was coated on the OTS separating layer coated in Step 1 by a spray coating method. After completing the coating, a thermal treatment was conducted on a hot-plate at 90° C. for 5 minutes to form a sacrificial layer having a thickness of about 0.5 to 2 μm.

Step 3: By using a gravure offset printing apparatus, an Ag paste (silver nano paste DGP, nano new material (ANP)) was coated on the sacrificial layer formed in Step 2 to form an Ag wiring having a line width of 20 to 500 μm and an interval of 20 to 2,000 μm. The thus formed wiring was heat treated on a hot-plate of 200° C. for 1 hour. After performing the heat treatment, the thickness of the Ag wiring was about 1 to 4 μm.

Step 4: On the Ag wiring formed in Step 3, a UV-curable polymer (NOA74: norland optical adhesives 74) was coated to a liquid state film having a certain thickness of 2 to 400 μm by means of a doctor blading method.

Step 5: A PET flexible substrate was put on the polymer layer coated in Step 4, and the substrate was rolled with a uniform weight to remove the bubbles included therein and to uniformly attach the substrate to the polymer layer. After attaching the PET flexible substrate, an ultraviolet light having a wavelength of 365 nm was irradiated to cure the curable polymer layer.

Step 6: Onto the glass substrate in Step 1, a physical force was applied to separate the sacrificial layer from the OTS separating layer. Then, the sacrificial layer was dissolved out to separate the polymer layer and the substrate manufactured in Step 5 and to manufacture an Ag wiring buried flexible substrate.

Example 17

Manufacture of a Metal Wiring Buried Flexible Substrate 17

A metal wiring buried flexible substrate was manufactured by conducting the same process described in Example 16 except for coating a fluorine resin of polytetrafluoroethylene (PTFE) as the separating layer in Step 1 in Example 16.

Example 18

Manufacture of a Metal Wiring Buried Flexible Substrate 18

Step 1: Octadecyltrichlorosilane (OTS) was coated as a Si-based separating layer on a glass substrate.

Step 2: Into distilled water, polyvinyl alcohol (PVA, molecular weight: 30,000-120,000, 99%, Sigma-Aldrich) was added by 10 wt % concentration to prepare a polyvinyl alcohol solution. This polyvinyl alcohol solution was coated on the OTS separating layer coated in Step 1 by a spray coating method. After completing the coating, a thermal treatment was conducted on a hot-plate at 90° C. for 5 minutes to form a sacrificial layer having a thickness of about 0.5 to 2 μm.

Step 3: By using a gravure offset printing apparatus, an Ag paste (silver nano paste DGP, nano new material (ANP)) was coated on the sacrificial layer formed in Step 2 to form an Ag wiring having a line width of 20 μm and an interval of 1,000 μm. The thus formed wiring was heat treated on a hot-plate of 200° C. for 1 hour. After performing the heat treatment, the thickness of the Ag wiring was about 1 to 4 μm.

Step 4: On the Ag wiring formed in Step 3, a UV-curable polymer (NOA74: norland optical adhesives 74) was coated to a liquid state film having a certain thickness and cured by irradiating an ultraviolet light having a wavelength of 365 nm to form a polymer layer having a thickness of 2 to 400 μm by means of a doctor blading method.

Step 5: Onto the glass substrate in Step 1, a physical force was applied to separate the sacrificial layer from the OTS separating layer. Then, the sacrificial layer was dissolved out to separate the polymer layer and the substrate manufactured in Step 4 and to manufacture an Ag wiring buried flexible substrate.

Step 6: On the Ag wiring buried flexible substrate formed in Step 5, a conductive polymer PEDOT:PSS (PH1000, CLEVIOS™) was coated by using a spray coating apparatus to form a transparent electrode and to manufacture a transparent electrode substrate combined with a metal wiring. A coating solution was prepared by adding dimethylsulfoxide (DMSO) in a mixing ratio of 5 wt % into PEDOT:PSS. The spray coating condition was as follows. The PEDOT:PSS solution was injected to a spray nozzle through a micro pump in a flowing rate of 200 m/min, and an argon (Ar) gas was injected with a pressure of 50 psi to spray the solution from the nozzle to perform the coating onto the flexible substrate. In this case, the distance between the nozzle and the substrate was 8 cm, the printing velocity was 1,800 cm/min, and the substrate velocity was 6 cm/min, and the coating was conducted twice to form a transparent electrode having a thickness of 147 nm.

Example 19

Manufacture of a Metal Wiring Buried Flexible Substrate 19

A metal wiring buried flexible substrate was manufactured by conducting the same process described in Example 18 except for coating a fluorine resin of polytetrafluoroethylene (PTFE) as the separating layer in Step 1 in Example 18.

Example 20

Manufacture of a Metal Wiring Buried Flexible Substrate 20

Step 1: Octadecyltrichlorosilane (OTS) was coated as a Si-based separating layer on a glass substrate.

Step 2: Into distilled water, polyvinyl alcohol (PVA, molecular weight: 30,000-120,000, 99%, Sigma-Aldrich) was added by 10 wt % concentration to prepare a polyvinyl alcohol solution. This polyvinyl alcohol solution was coated on the OTS separating layer coated in Step 1 by a spray coating method. After completing the coating, a thermal treatment was conducted on a hot-plate at 90° C. for 5 minutes to form a sacrificial layer having a thickness of about 0.5 to 2 μm.

Step 3: By using a gravure offset printing apparatus, an Ag paste (silver nano paste DGP, nano new material (ANP)) was coated on the sacrificial layer formed in Step 2 to form an Ag wiring having a line width of 20 μm and an interval of 20 to 2,000 μm. The thus formed wiring was heat treated on a hot-plate of 200° C. for 1 hour. After performing the heat treatment, the thickness of the Ag wiring was about 1 to 2 μm.

Step 4: On the Ag wiring formed in Step 3, a UV-curable polymer (NOA74: norland optical adhesives 74) was coated to a liquid state film having a certain thickness by means of a doctor blading method and cured by irradiating an ultraviolet light having a wavelength of 365 nm to manufacture a polymer layer having a thickness of 2 to 400 μm.

Step 5: Onto the glass substrate in Step 1, a physical force was applied to separate the sacrificial layer from the OTS separating layer. Then, the sacrificial layer was dissolved out to separate the polymer layer and the substrate manufactured in Step 4 and to manufacture an Ag wiring buried flexible substrate.

Step 6: On the exposed surface of the Ag wiring buried flexible substrate formed in Step 5, a copper electrode was formed through an electroplating method to manufacture a flexible substrate including a metal wiring electroplated with the copper electrode. In this case, the electroplating condition for forming the copper electrode was as follows. Into 1

L of an aqueous solution, 200 g of $Cu_2SO_4$, 60 mL of $H_2SO_4$ and a 50 ppm of HCl solution were added to prepare an electroplating solution. By applying current of 400 mA/cm$^2$ for 5 to 60 minutes using the copper electrode as an anode and the sample (Ag wiring buried flexible substrate) as a cathode, a copper electrode having a thickness of 0.1 to 10 μm was manufactured.

Example 21

Manufacture of a Metal Wiring Buried Flexible Substrate 21

A metal wiring buried flexible substrate was manufactured by conducting the same process described in Example 20 except for coating a fluorine rosin of polytetrafluoroethylene (PTFE) as the separating layer in Step 1 in Example 20.

Comparative Example 1

The same process was conducted as described in Example 14 except for depositing diamond like carbon (DLC) as a separating material instead of forming the polyvinyl alcohol sacrificial layer in Step 1 in Example 14, and separating a flexible substrate from a glass substrate by applying a physical force. In this case, a DLC deposition was conducted by means of a plasma enhanced chemical vapor deposition (PECVD) method.

Comparative Example 2

The same process was conducted as described in Example 14 except for coating a Si releasing agent (KS839, Shin-Etsu Chemical Co., Ltd.) instead of forming the polyvinyl alcohol sacrificial layer in Step 1 in Example 14, and separating a flexible substrate from a glass substrate by applying a physical force.

Comparative Example 3

Step 1: a Si releasing agent (KS839, Shin-Etsu Chemical Co., Ltd.) was coated on a polyimide substrate having a thickness of 50 μm.
Step 2: On the Si releasing agent coated in Step 1, an Ag paste (silver nano paste DGP, nano new material (ANP)) was coated and heat treated at 180° C. for 1 hour to form a metal wiring.
Step 3: A liquid phase polyimide solution (PI-080-051, Vtec Co.) was coated on the metal wiring formed in Step 2 by means of a doctor blading method to a thickness of 50 μm and heat treated at 250° C. for 10 minutes to manufacture a metal wiring buried polyimide flexible substrate.
Step 4: The metal wiring buried polyimide flexible substrate was separated from the polyimide substrate in Step 1 by applying a physical force.

Experiment 1

Analysis on Surface Thickness (1) Analysis on Surface Thickness of Metal Wiring 1
The surface of the Ag wiring formed by conducting Step 2 in Example 1 and the surface of the Ag wiring burred flexible substrate manufactured by conducting Step 4 were analysed by means of a surface analyser (Denkor, P-11, α-step profiler). The results are illustrated in FIG. 12.

Figure 12:
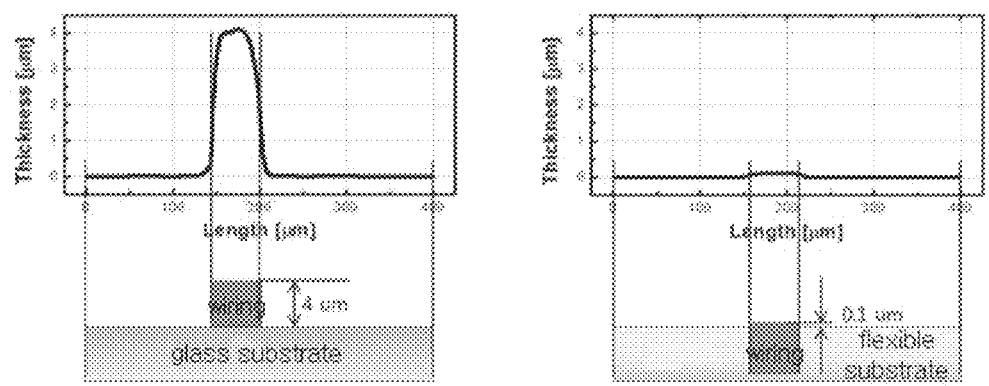
FIG. 12 illustrates graphs obtained by analyzing the surface of a metal wiring buried flexible substrate according to Example 1 of the present invention by using a surface analyzer.

As illustrated in FIG. 12, the Ag wiring on the glass substrate was formed to a thickness of 4 μm, and the Ag wiring on the Ag wiring buried flexible substrate was extruded to about 0.1 μm (100 nm). That is, the extruded degree of the Ag wiring was found to be very small and the manufacture of a metal wiring buried flexible substrate according to the method of the present invention was confirmed.

(2) Analysis on Surface Thickness of Metal Wiring 2
The surface of the flexible substrate was analysed by means of a surface analyser (Denkor, P-11, α-step profiler) before and after conducting the electroplating in Step 5 in Example 13. The results are illustrated in FIG. 13.

Figure 13:
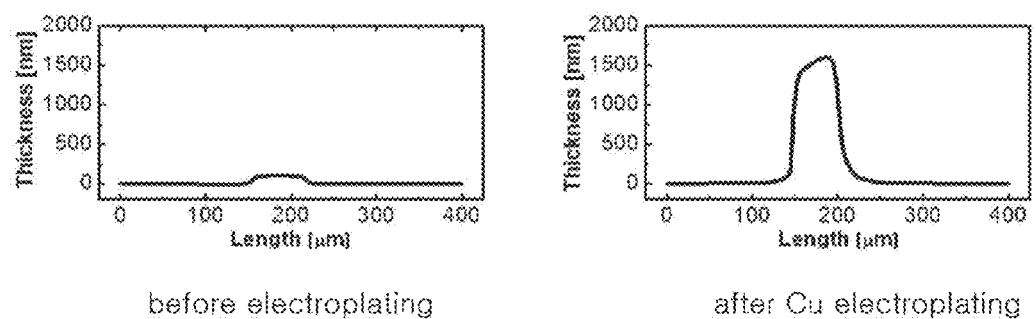
FIG. 13 illustrates graphs obtained by analyzing the surface of a metal wiring buried flexible substrate according to Example 13 of the present invention by using a surface analyser.

As illustrated in FIG. 13, an electrode having a height of about 1.5 μm was found to be formed on the metal wiring after conducting the electroplating. In addition, an electrode for passivating the metal wiring was found to be formed through the electroplating.

Experiment 2

Observation by Scanning Electron Microscope

The surface of the flexible substrate was observed by means of a scanning electron microscope before and after conducting the electroplating in Step 5 in Example 13. The results are illustrated in FIG. 14.

Figure 14:
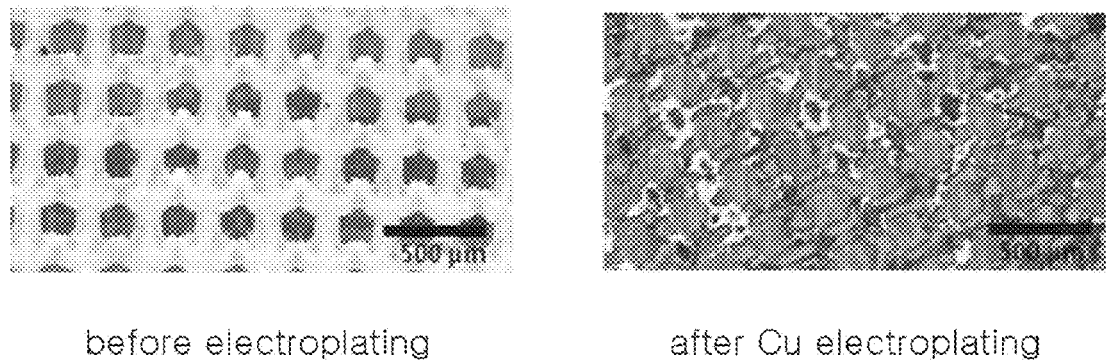
FIG. 14 illustrates photographs on the surface of a flexible substrate before and after electroplating a copper electrode according to Example 13 of the present invention by using a scanning electron microscope.

As illustrated in FIG. 14, a copper electrode was found to be formed on the exposed surface of the metal wiring after conducting the electroplating. In addition, an electrode for passivating the metal wiring was found to be formed through the electroplating.

Experiment 3

Analysis on Metal Wiring Pattern of Separated Flexible Substrate

The metal wiring buried flexible substrate manufactured in Example 14 and the metal wiring pattern of the flexible substrate formed in Comparative Example 1 were compared and analyzed. The results are illustrated in FIGS. 15 and 16.

Figure 15:
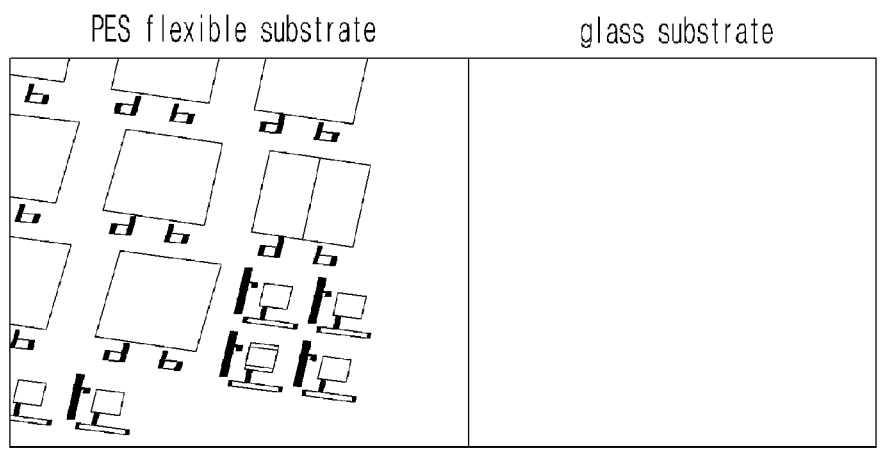
FIG. 15 illustrates photographs on a metal wiring buried flexible substrate and a separated glass substrate according to Example 14 of the present invention.
Figure 16:
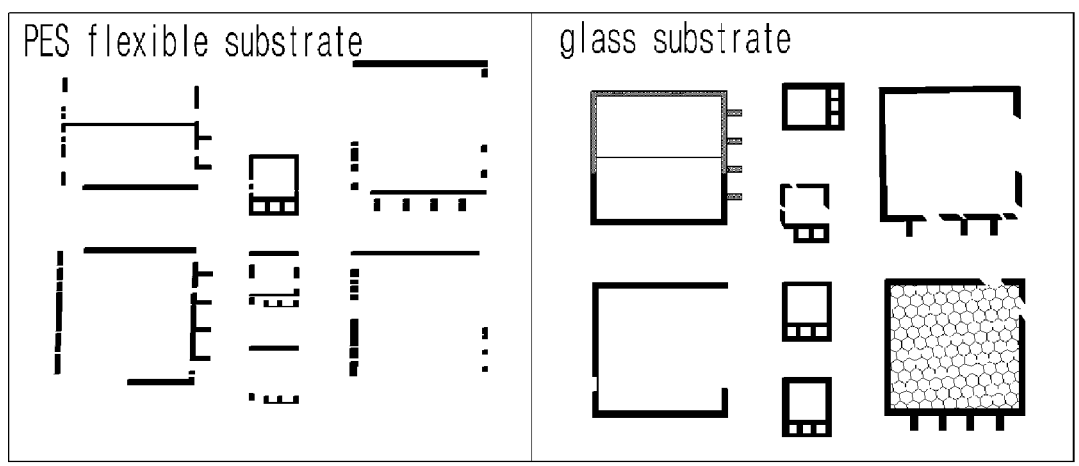
FIG. 16 illustrates photographs on a flexible substrate and a separated glass substrate according to Comparative Example 1.

As illustrated in FIG. 15, the metal wiring pattern was not found remaining on the glass substrate for the flexible substrate manufactured by using the sacrificial layer in Example 14 of the present invention. On the contrary, as illustrated in FIG. 16, the metal wiring pattern remained on the glass substrate because of the incomplete separation of the metal wiring from the glass substrate for the flexible substrate manufactured by using the separating agent DLC in Comparative Example 1. That is, a portion of the metal wiring may remain on the substrate when using a common separating agent, and the pattern of the metal wiring may not be maintained.

Through the above described result, the metal wiring may be found to be separated from the substrate while maintaining the original shape thereof in the method of manufacturing a metal wiring buried flexible substrate according to the present invention by using a sacrificial layer. In addition, a complicated metal wiring may be confirmed to be buried in a flexible substrate while maintaining the original shape thereof.

Experiment 4

X-Ray Photoelectrical Spectroscopy (XPS)

The surface of the metal wiring buried flexible substrate manufactured in Example 9 according to the present invention and the surface of the flexible substrate manufactured in Comparative Example 2 were analyzed by an X-ray photoelectron spectroscopy. The results are illustrated in FIGS. 17 and 18.

Figure 17:
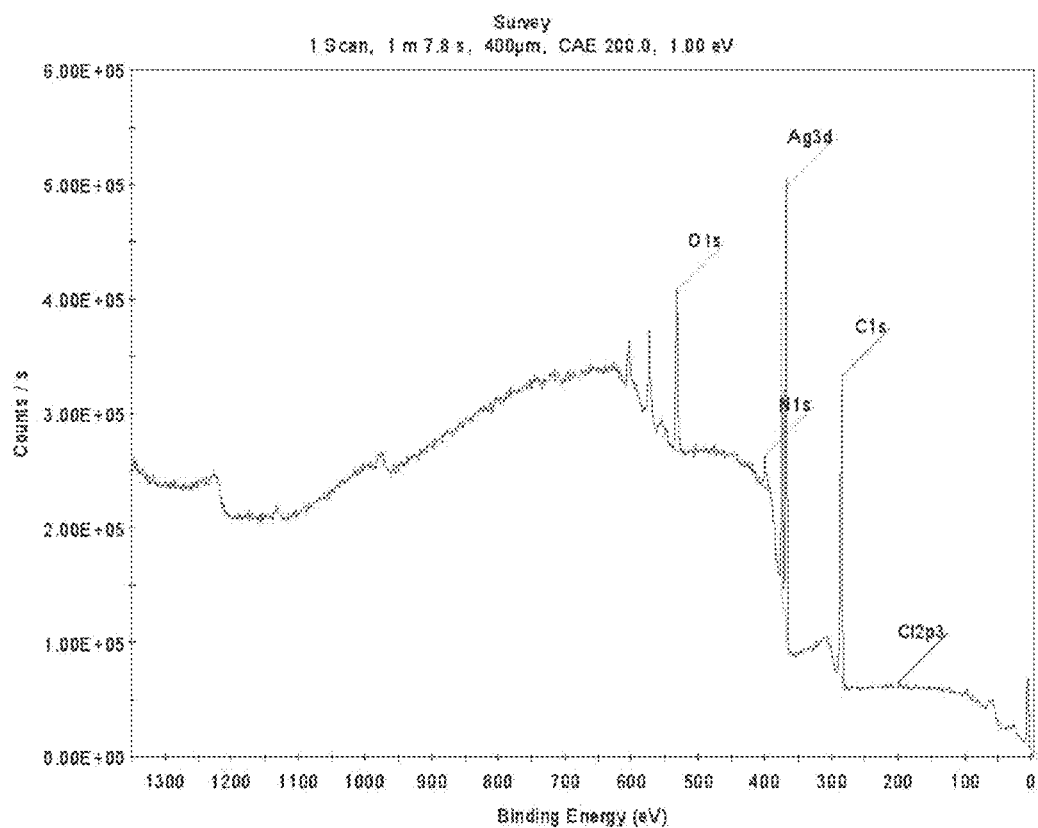
FIG. 17 is a graph illustrating analyzed results by an X-ray photoelectron spectroscopy (XPS) on the surface of a metal wiring buried flexible substrate according to Example 8 of the present invention.

As illustrated in FIG. 17, the Si-based OTS used as the separating agent was not found to remain on the surface of the metal wiring buried flexible substrate according to Example 8 of the present invention. From the result, the sacrificial layer was confirmed to be easily removed and remain no residue on the surface of the flexible substrate.

Figure 18:
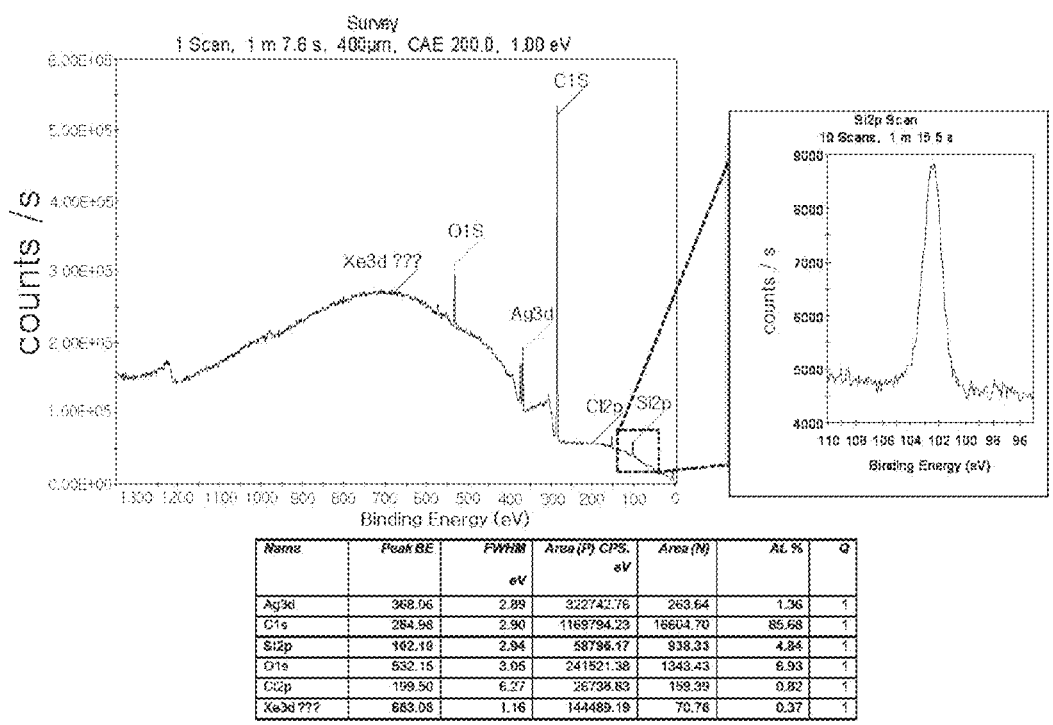
FIG. 18 is a graph illustrating analyzed results by an XPS on the surface of a metal wiring buried flexible substrate according to Comparative Example 2.

On the contrary, as illustrated in FIG. 18, the Si-based material used as the separating agent was found on the surface of the flexible substrate manufactured in comparative Example 2. That is, the releasing material used as the separating agent was found to remain on the manufactured surface of the flexible substrate.

When a simple releasing material is used as a separating material, the releasing material used as the separating material may remain on a manufactured flexible substrate. In this case, the manufactured flexible substrate may not be applied in electronic equipments requiring a high precision.

However, when a metal wiring buried flexible substrate is manufactured by using a sacrificial layer according to the method of the present invention, the sacrificial layer may be removed and may not remain on one flexible substrate. In this case, the metal wiring buried flexible substrate may be applied in an electronic device such as a solar battery, a display, etc.

The invention claimed is:

1. A method of manufacturing a metal wiring buried flexible substrate comprising:
   coating a sacrificial layer including a polymer soluble in water or an organic solvent, or a photodegradable polymer on a substrate (Step 1);
   forming a metal wiring on the sacrificial layer in Step 1 (Step 2);
   forming a metal wiring buried polymer layer by coating a curable polymer on the sacrificial layer including the metal wiring formed thereon in Step 2 and curing (Step 3); and
   separating the polymer layer in Step 3 from the substrate in Step 1 by removing through dissolving in the water or the organic solvent or photodegrading only the sacrificial layer present between the substrate in Step 1 and the polymer layer in Step 3 (Step 4).

2. The method as set forth in claim 1, further comprising attaching a functional flexible substrate on the curable polymer before curing the curable polymer in step 3.

3. The method as set forth in claim 2, wherein a surface of the functional flexible substrate is coated with an ultraviolet shielding layer, a wavelength controlling layer, a light focusing layer, an anti-fouling layer or a moisture/oxygen permeation preventing layer, or is texturing treated.

4. The method as set forth in claim 1, further comprising depositing or coating a transparent electrode on an exposed surface portion of the metal wiring of the separated polymer in step 4.

5. The method as set forth in claim 4, wherein the transparent electrode is formed by
   a metal oxide or a metal oxide-metal-metal oxide selected from the group consisting of indium tin oxide (ITO), indium zinc oxide (MO), indium zinc tin oxide (IZTO), aluminum zinc oxide (AZO), gallium zinc oxide (GZO), fluorine tin oxide (FTO), indium tin oxide-silver-indium tin oxide (ITO-Ag-ITO)), indium zinc oxide-silver-indium zinc oxide (IZO-Ag-IZO), indium zinc tin oxide-silver-indium zinc tin oxide (IZTO-Ag-IZTO) and aluminum zinc oxide-silver-aluminum zinc oxide (AZO-Ag-AZO);
   an organic conductive material of PEDOT:PSS or polyaniline (PANT);
   a thin film including a silver thin film or a gold thin film;
   a thin film including a silver nanowire, a gold nanowire, a copper nanowire or a platinum nanowire; or
   a carbon-based material including a carbon nanotube or graphene.

6. The method as set forth in claim 1, further comprising electroplating a metal electrode on an exposed surface portion of the metal wiring of the separated polymer layer from the substrate in step 4.

7. The method as set forth in claim 1, further comprising coating a separating layer on the substrate before coating a sacrificial layer in step 1,
   wherein the separating layer is one of a fluorine-based resin and a silicon resin.

8. The method as set forth in claim 1, wherein the sacrificial layer is formed by coating a polymer selected from the group consisting of polyvinyl alcohol, polyethylene glycol and carboxymethyl cellulose, or a polymethyl methacrylate (PMMA), or a photosensitive polymer (photoresist, PR).

9. The method as set forth in claim 1, wherein the metal wiring is formed by coating silver (Ag), copper (Cu), aluminum (Al), gold (Au), platinum (Pt), nickel (Ni), titanium (Ti) or an alloy thereof.

10. The method as set forth in claim 1, wherein the metal wiring is formed by coating one selected from the group consisting of indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO) and aluminum zinc oxide-silver-aluminum zinc oxide (AZO-Ag-AZO), or a mixture thereof.

11. The method as set forth in claim 1, wherein the metal wiring is formed by an inkjet printing, a gravure printing, a gravure offset, an aerosol printing, a screen printing, an electroplating, a vacuum deposition or a photolithography process.

12. The method as set forth in claim 1, wherein the curable polymer is one selected from the group consisting of polyethylene terephthalate (PET), polyethylene sulfone (PES), polyethylene naphthalate (PEN), polycarbonate (PC), polymethyl methacrylate (PMMA), polyimide (PI), ethylene vinyl acetate (EVA), amorphous polyethylene terephthalate (APET), polypropylene terephthalate (PPT), polyethylene terephthalate glycerol (PETG), polycyclohexylene dimethylene terephthalate (PCTG), modified triacetyl cellulose (TAC), cycloolefin polymer (COP), cycloolefin copolymer (COC), dicyclopentadiene polymer (DCPD), cyclopentadiene polymer (CPD), polyarylate (PAR), polyether imide (PEI), polydimethyl siloxane (PDMS), a silicon resin, a fluorine resin and a modified epoxy resin.

13. The method as set forth in claim 1, wherein the curing is a thermal curing, an ultraviolet curing, a moisture curing, a dry curing, a chemical reaction curing, a microwave curing, an infrared (IR) curing or a cooling curing.

* * * * *